(12) United States Patent
Park et al.

(10) Patent No.: US 9,337,418 B2
(45) Date of Patent: May 10, 2016

(54) METHOD OF MANUFACTURING A MAGNETORESISTIVE RANDOM ACCESS MEMORY DEVICE

(71) Applicant: Samsung Electronics Co., Ltd., Suwon-si, Gyeonggi-do (KR)

(72) Inventors: Jong-Chul Park, Seongnam-si (KR); Jae-Hun Seo, Suwon-si (KR); Byong-Jae Bae, Hwaseong-si (KR); Chang-Woo Sun, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/208,912

(22) Filed: Mar. 13, 2014

(65) Prior Publication Data

US 2014/0273287 A1    Sep. 18, 2014

(30) Foreign Application Priority Data

Mar. 14, 2013 (KR) .......................... 10-2013-0027037

(51) Int. Cl.
*H01L 43/12* (2006.01)
*H01L 27/22* (2006.01)

(52) U.S. Cl.
CPC .............. *H01L 43/12* (2013.01); *H01L 27/228* (2013.01)

(58) Field of Classification Search
None
See application file for complete search history.

(56) References Cited

U.S. PATENT DOCUMENTS

| | | | |
|---|---|---|---|
| 6,560,135 B2 | 5/2003 | Matsuoka et al. | |
| 6,783,994 B2 | 8/2004 | Rizzo et al. | |
| 7,706,175 B2 | 4/2010 | Hosotani et al. | |
| 2005/0046048 A1 | 3/2005 | Yun et al. | |
| 2008/0185670 A1 | 8/2008 | Kajiyama | |
| 2010/0289098 A1 | 11/2010 | Li et al. | |
| 2011/0101478 A1 | 5/2011 | Zhong et al. | |
| 2011/0229985 A1 | 9/2011 | Li | |
| 2011/0266600 A1 | 11/2011 | Kanaya et al. | |
| 2014/0264672 A1* | 9/2014 | Park et al. ..................... 257/421 |

\* cited by examiner

*Primary Examiner* — Scott B Geyer
(74) *Attorney, Agent, or Firm* — Lee & Morse, P.C.

(57) ABSTRACT

A method of manufacturing magnetoresistive random access memory (MRAM) device includes forming first and second patterns on a substrate in an alternating and repeating arrangement, forming a first capping layer on top surfaces of the first and second patterns, and removing first portions of the first capping layer and a portion of the second patterns thereunder to form first openings exposing the substrate. The method further includes forming source lines filling lower portions of the first openings, respectively, forming second capping layer patterns filling upper portions of the first openings, respectively, and removing second portions of the first capping layer and a portion of the second patterns thereunder to form second openings exposing the substrate. Then, contact plugs and pad layers are integrally formed and sequentially stacked on the substrate to fill the second openings.

22 Claims, 36 Drawing Sheets

FIRST
DIRECTION ⊗ ⟶ SECOND
DIRECTION

FIRST
DIRECTION ⊗ ⟶ SECOND
DIRECTION

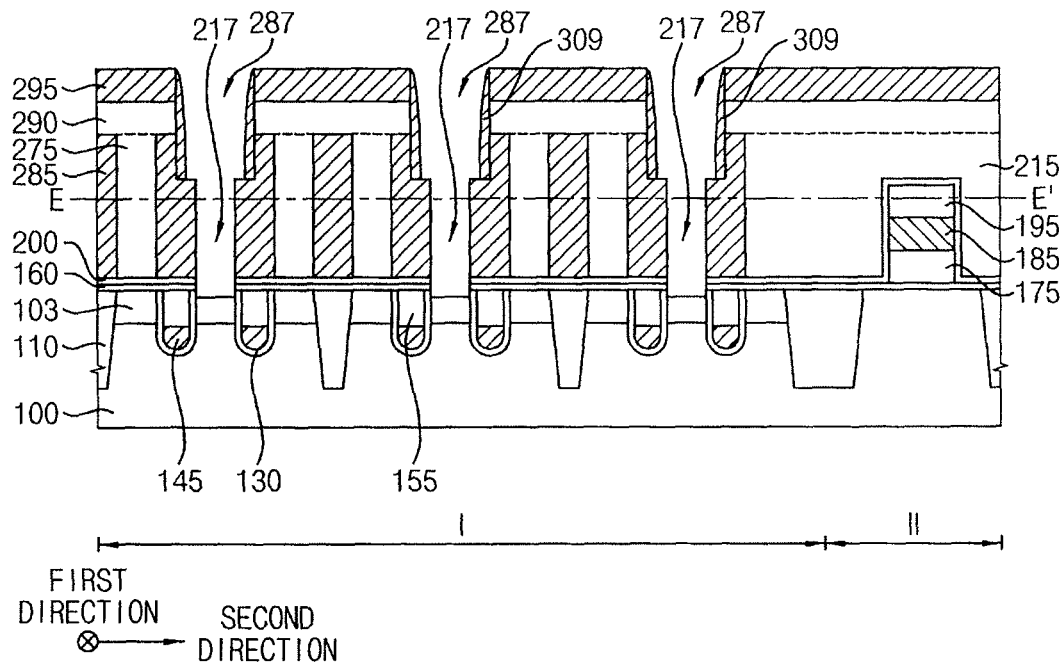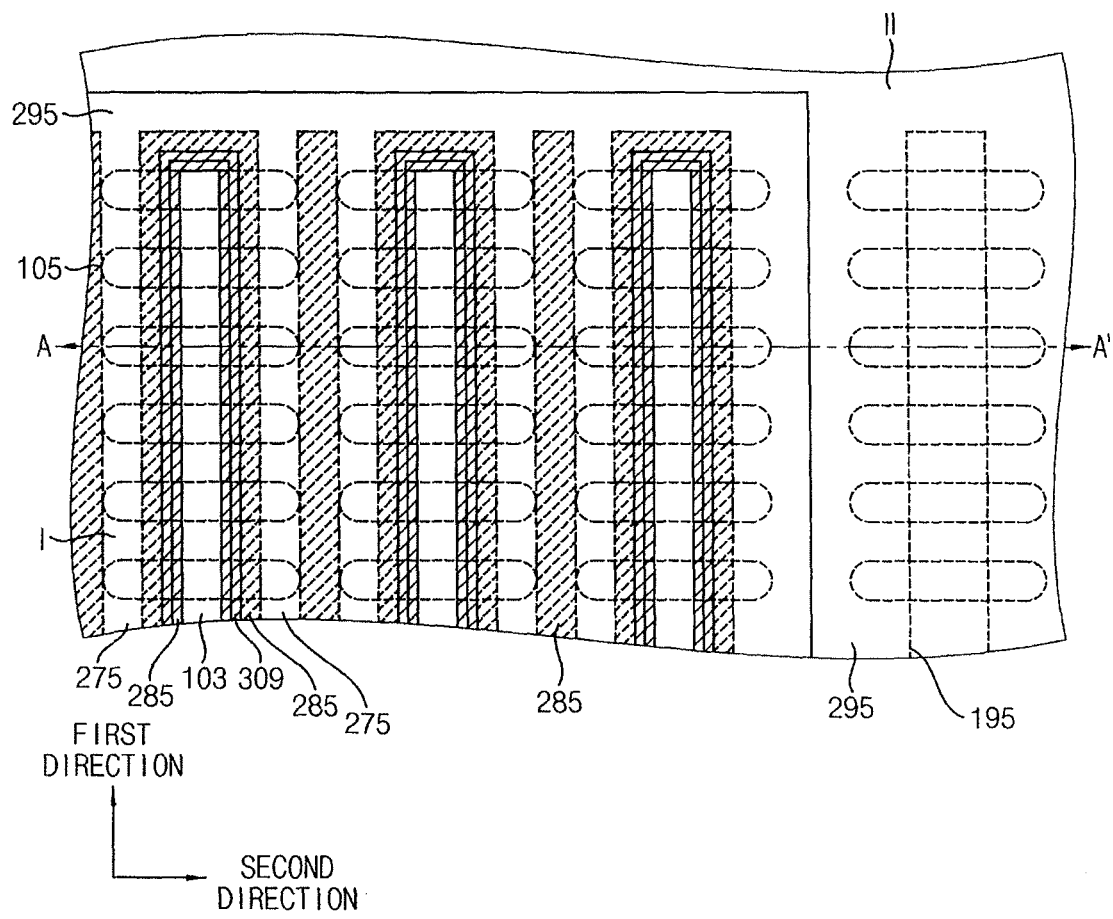

METHOD OF MANUFACTURING A MAGNETORESISTIVE RANDOM ACCESS MEMORY DEVICE

CROSS-REFERENCE TO RELATED APPLICATION

Korean Patent Application No. 10-2013-0027037, filed on Mar. 14, 2013, and entitled, "Magnetoresistive Random Access Memory Device and Method Of Manufacturing The Same," is incorporated by reference herein in its entirety.

BACKGROUND

1. Field

One or more embodiments described herein relate to semiconductor device.

2. Description of the Related Art

A magnetic tunnel junction (MTJ) structure of a magnetoresistive random access memory (MRAM) device may be connected to a contact plug, which is electrically connected to a substrate. The contact plug and MTJ structure may not be directly connected. As result, a pad must be formed to connect the contact plug and MTJ structure. The pad may have a minute size. Therefore, a patterning process for forming the pad needs to be highly accurate. Existing pad-forming methods are unable to attain this level of accuracy.

SUMMARY

In accordance with one embodiment, a method of manufacturing a magnetoresistive random access memory (MRAM) device includes forming first and second patterns on a substrate, the first and second patterns being disposed alternately and repeatedly and contacting each other; forming a first capping layer on top surfaces of the first and second patterns; removing first portions of the first capping layer and a portion of the second patterns thereunder to form first openings exposing the substrate; forming source lines filling lower portions of the first openings, respectively; forming second capping layer patterns filling upper portions of the first openings, respectively; removing second portions of the first capping layer and a portion of the second patterns thereunder to form second openings exposing the substrate; and integrally forming contact plugs and pad layers sequentially stacked on the substrate to fill the second openings, respectively.

Forming the first openings may include removing the first portions of the first capping layer, upper portions of the portion of the second patterns thereunder, and upper portions of the first patterns adjacent to the portion of the second patterns to form recesses; forming etch stop layer patterns covering sidewalls of the first capping layer exposed by the recesses; and removing lower portions of the portion of the second patterns exposed by the recesses to form third openings exposing the substrate, the third openings being in fluid communication with the recesses, respectively.

Forming the third openings may include removing the lower portions of the portion of the second patterns by a wet etch process. The first patterns, the etch stop layer patterns, and the second capping layer patterns may be formed to include substantially a same material, and the first capping layer and the second patterns may be formed to include substantially a same material.

The first patterns, the etch stop layer patterns, and the second capping layer patterns may be formed to include silicon nitride, and the first capping layer and the second patterns may be formed to include silicon oxide.

Forming the etch stop layer patterns may include forming an etch stop layer on inner walls of the recesses and the first capping layer; and anisotropically etching the etch stop layer to form the etch stop layer patterns on sidewalls of the recesses.

Forming the source lines may include forming a conductive layer filling the third openings and at least a portion of the recesses; and removing an upper portion of the conductive layer to form the source lines filling the third openings, respectively.

Forming the second capping layer patterns may include forming a second capping layer on the source lines and the first capping layer to fill the recesses; and planarizing an upper portion of the second capping layer until a top surface of the first capping layer is exposed.

Forming the second openings may include removing the second portions of the first capping layer and the portion of the second patterns thereunder by a wet etch process.

The method may further include dividing each pad layer into a plurality of pads, after integrally forming the contact plugs and the pad layers. The method may further include forming MTJ structures electrically connected to respective ones of the pads, after dividing each pad layer into the plurality of pads. The MTJ structures may be formed at vertices and centers of hexagons when viewed from a top side.

Dividing each pad layer into the plurality of pads may include partially removing the pad layers to form fourth openings exposing top surfaces of the first patterns; and forming division layer patterns filling the fourth openings, respectively.

Forming the first and second patterns may include forming the first and second patterns on the substrate alternately and repeatedly in a second direction substantially parallel to a top surface of the substrate, each of the first patterns and each of the second patterns extending in a first direction substantially parallel to the top surface of the substrate and substantially perpendicular to the second direction, and wherein forming the first openings includes forming the first openings to extend in the first direction.

Forming the first openings may include removing $(3n-2)^{th}$ second patterns in the second direction, where n is a positive integer. Forming the second openings may include removing the second portions of the first capping layer, and $(3n)^{th}$ and $(3n-1)^{th}$ second patterns in the second direction.

Dividing each pad layer into two pads may be performed after integrally forming the contact plugs and the pad layers. After forming the second capping layer patterns, the method may include forming a mask on the first capping layer and the second capping layer patterns, the mask including a plurality of fifth openings disposed in the first direction, each of the fifth openings extending in the second direction; removing third portions of the first capping layer and a portion of the second patterns thereunder to form sixth openings; and forming third patterns filling the sixth openings, respectively.

Forming the sixth openings may include removing the third portions of the first capping layer and the portion of the second patterns thereunder by a dry etching process, and wherein the source lines are protected by the second capping layer patterns during the dry etching process. The third patterns may be formed to include substantially a same material as the first patterns and the second capping layer patterns.

In accordance with another embodiment, a magnetoresistive random access memory (MRAM) device includes a plurality of source lines disposed in a second direction on a substrate, each of the source lines extending in a first direction; a plurality of contact plugs on the substrate between the source lines, the plurality of contact plugs being disposed in the first and second directions; a plurality of pads on respective ones of the contact plugs, each of the pads integrally formed with a respective one of the contact plugs; and a plurality of magnetic tunnel junction (MTJ) structures on respective ones of the pads, wherein the MTJ structures are arranged at vertices and centers of hexagons.

The MRAM device may further include insulation layer patterns surrounding sidewalls of the contact plugs and the source lines; an etch stop layer pattern covering a sidewall of each pad; a division layer pattern covering a sidewall of each pad; and a capping layer pattern covering a top surface of each source line. The insulation layer patterns, the etch stop layer patterns, the division layer patterns, and the capping layer patterns may include substantially a same material, and top surfaces of the capping layer patterns and the etch stop layer patterns may be substantially coplanar with top surfaces of the pads.

The MRAM device may further include a plurality of gate structures buried at upper portions of the substrate, the plurality of buried gate structures disposed in the second direction and each buried gate structure extending in the first direction, wherein each source line may be disposed on the substrate between the buried gate structures, and wherein the contact plugs do not overlap the buried gate structures.

In accordance with another embodiment, a memory device includes a plurality of source lines on a substrate; a plurality of contact plugs on the substrate, at least one contact plug between a respective pair of the source lines; a plurality of pads on respective ones of the contact plugs, each of the pads integrally formed with at least one of the contact plugs; and a plurality of magnetic tunnel junction (MTJ) structures on respective ones of the pads, wherein the pads and contact plugs are formed of a same material.

Each pad may be self-aligned with a corresponding one of the contact plugs. Also, each pad may be integrally formed with adjacent ones of the contact plugs. The contact plugs may have a planarized top surface.

In accordance with another embodiment, a method for making a semiconductor device includes forming source lines on a substrate; forming a number of contact plugs between respective pairs of the source lines; forming pad layers over the contact plugs; and forming MTJ structures electrically connected to respective ones of the pads, wherein each pad layer is in contact with at least of the contact plugs and wherein the contact plugs are integrally formed in a same operation as the pad layers. Each pad layer may be in contact with at least of the contact plugs, and the contact plugs may be integrally formed in a same operation as the pad layers. The number may be greater than 1.

BRIEF DESCRIPTION OF THE DRAWINGS

Features will become apparent to those of ordinary skill in the art by describing in detail exemplary embodiments with reference to the attached drawings in which:

FIGS. 1, 3, 4, 6, 8, 9, 11, 12, 14, 15, 17, 19, 21, 23, 24, 26, 28, 30, 32, 34, 36, 38, 39, 40, 42, 43, 44, 47, 49, 51, 52, 54 and 55 illustrate vertical cross-sectional views of one embodiment of an MRAM device;

FIGS. 25, 29, 31 and 45 illustrate horizontal cross-sectional views of the MRAM device.

DETAILED DESCRIPTION

Figure 1:
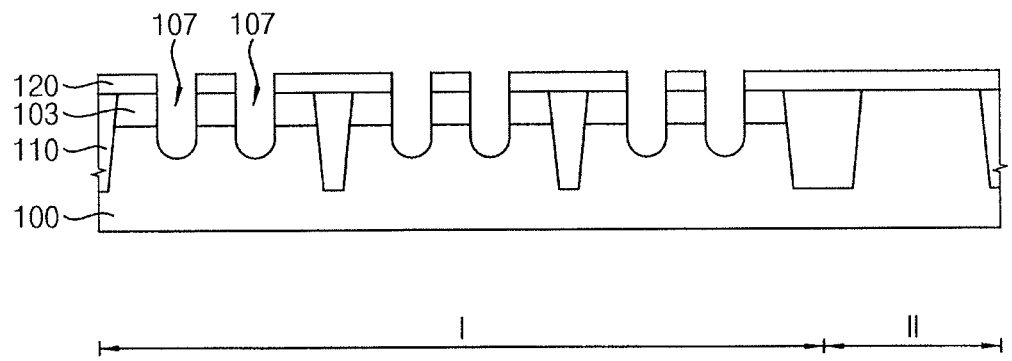

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 54:
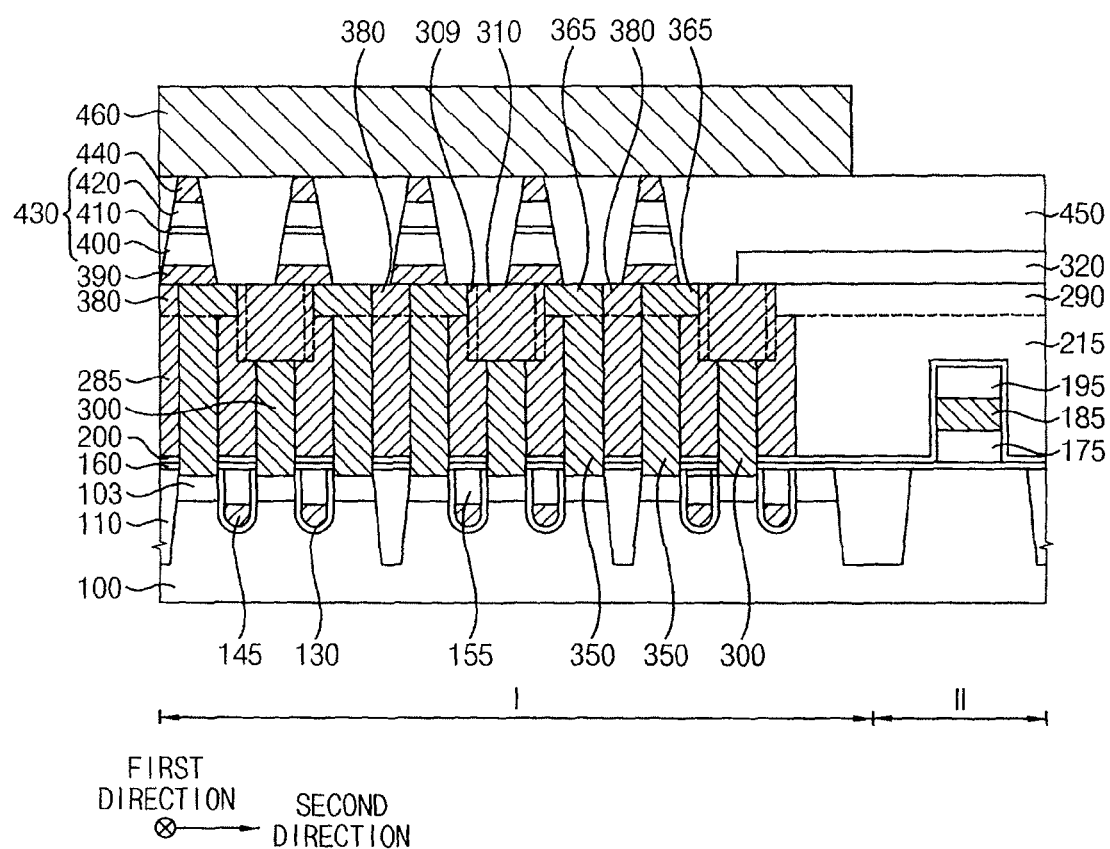
Figure 55:
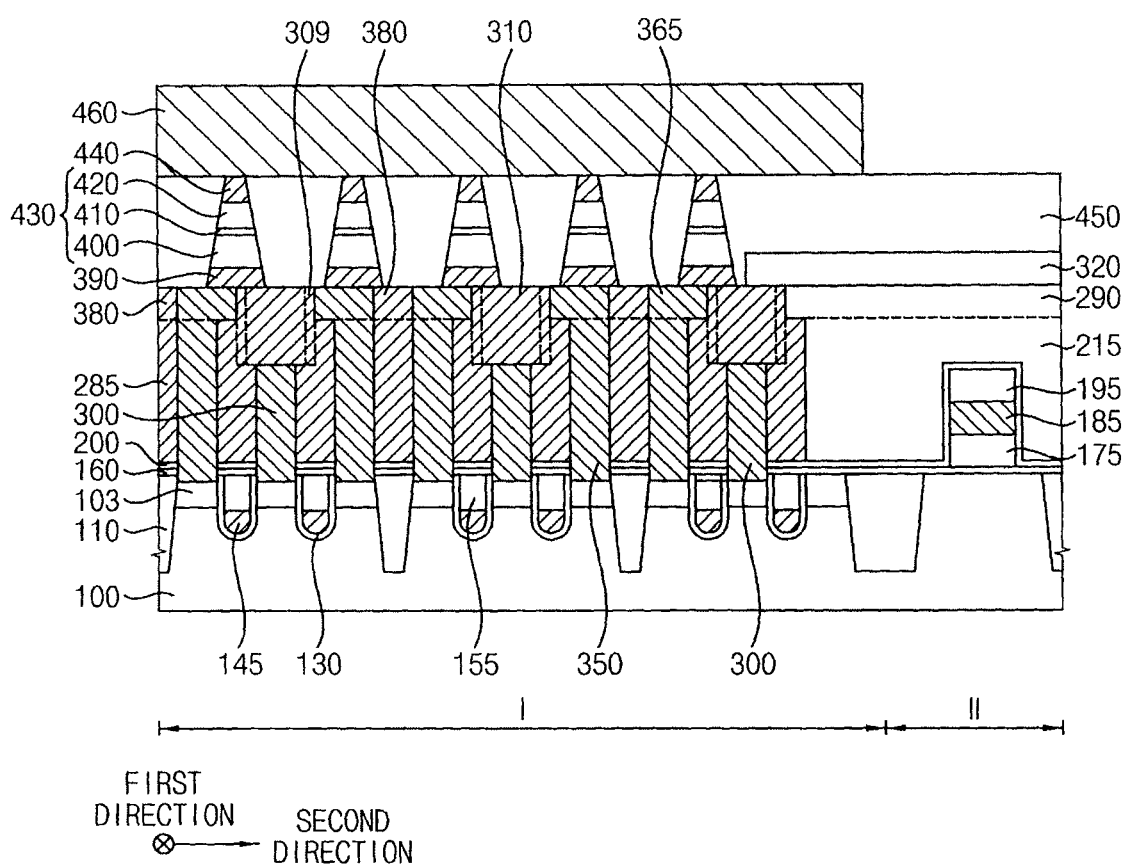
Figure 56:
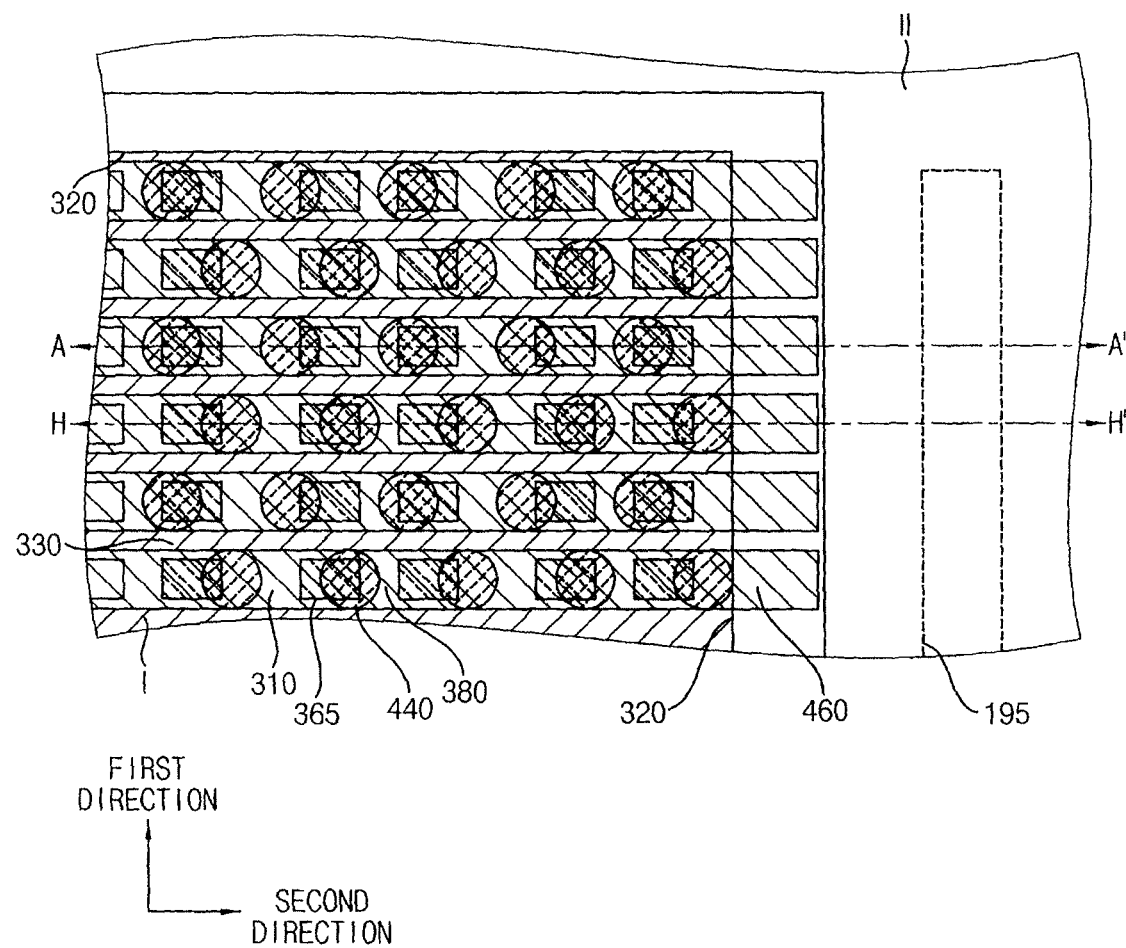

FIGS. 1 to 56 illustrate cross-sectional views and plan views of various stages of an embodiment of a method of manufacturing an MRAM device. Particularly, FIGS. 1, 3, 4, 6, 8, 9, 11, 12, 14, 15, 17, 19, 21, 23, 24, 26, 28, 30, 32, 34, 36, 38, 39, 40, 42, 43, 44, 47, 49, 51, 52, 54 and 55 illustrate vertical cross-sectional views of the MRAM device, FIGS. 25, 29, 31 and 45 are horizontal cross-sectional views of the MRAM device, and FIGS. 2, 5, 7, 10, 13, 16, 18, 20, 22, 27, 33, 35, 37, 41, 46, 48, 50, 53 and 56 illustrate plan views of the MRAM device.

Figure 40:
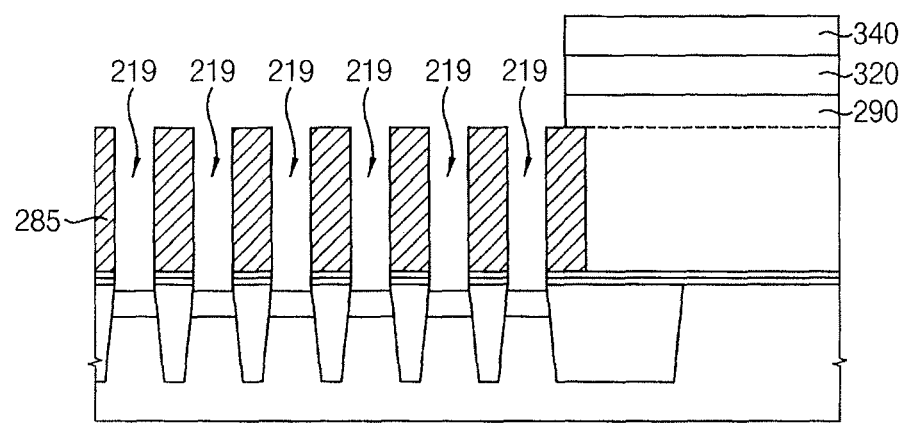
Figure 41:
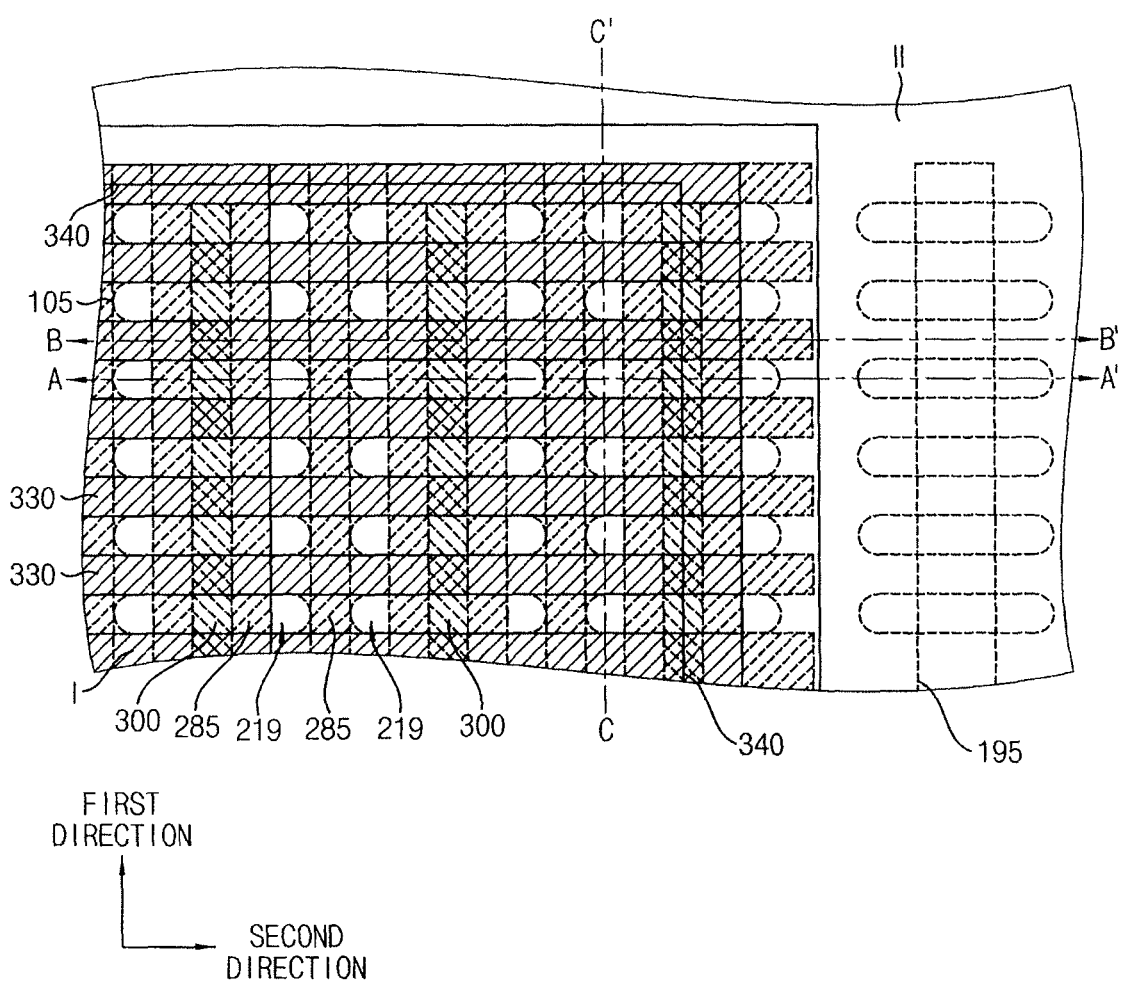
Figure 42:
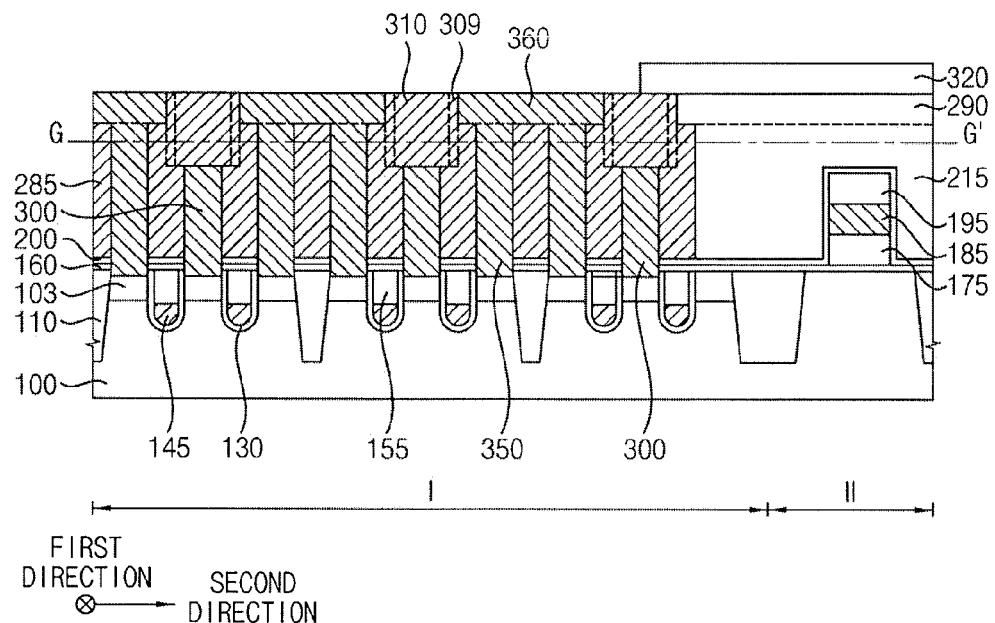
Figure 43:
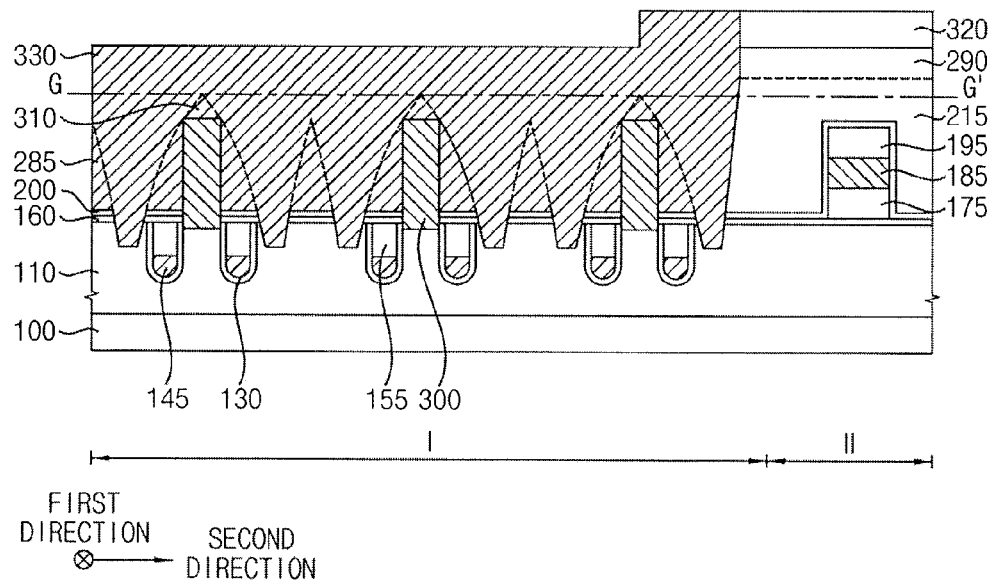
Figure 44:
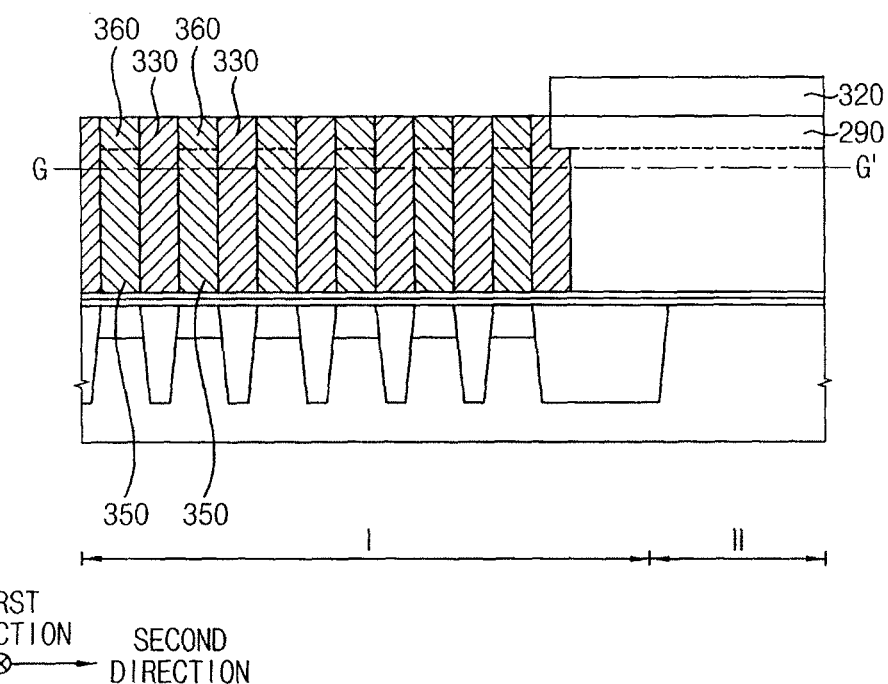
Figure 51:
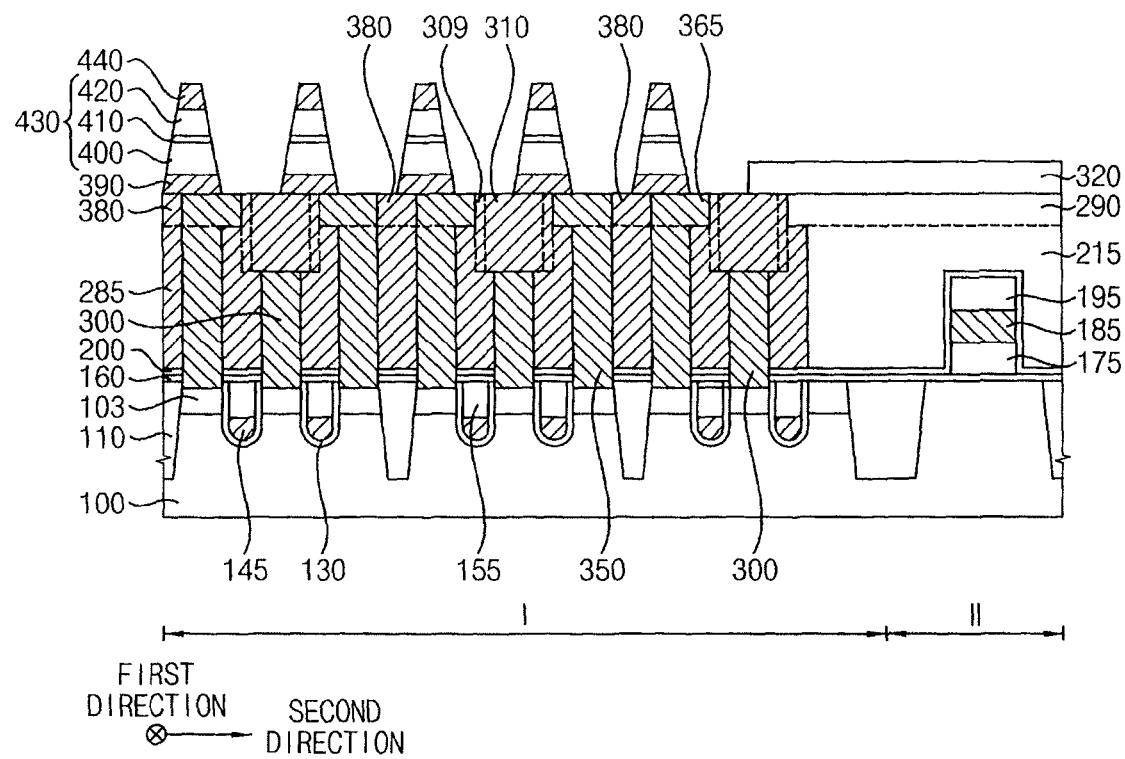
Figure 52:
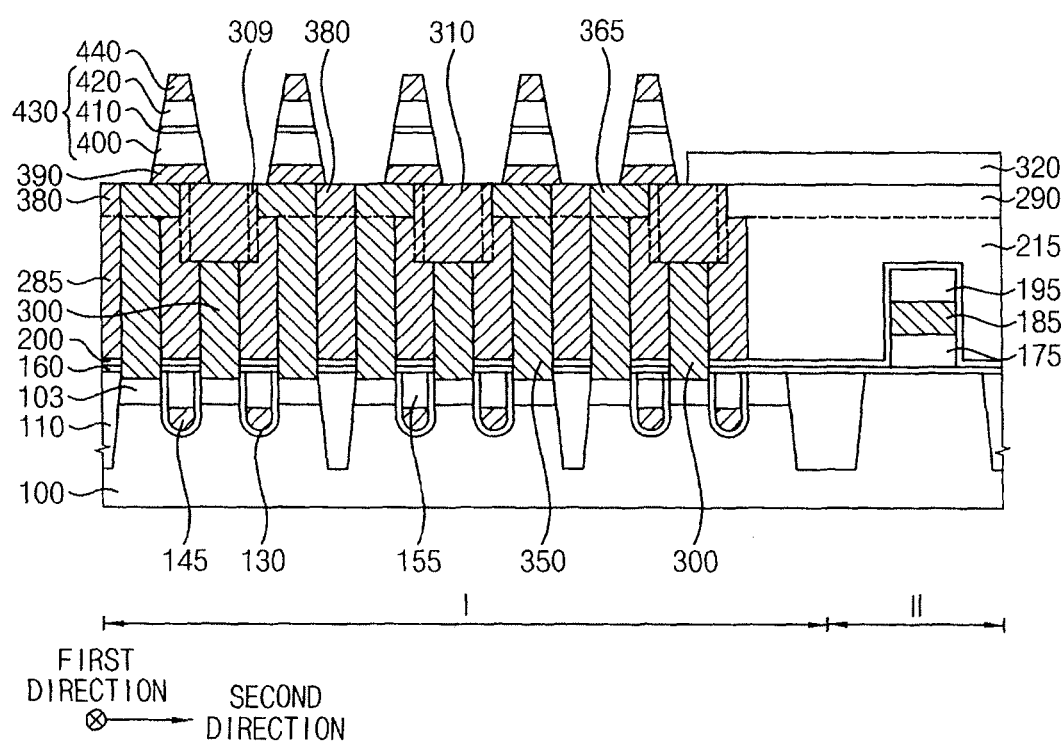

FIGS. 1, 3, 4, 6, 8, 9, 11, 12, 14, 15, 17, 19, 21, 23, 24, 26, 28, 30, 32, 38, 42, 47, 49, 51 and 54 illustrate vertical cross-sectional views cut along a line A-A', FIGS. 34, 36, 39 and 43 illustrate vertical cross-sectional views cut along a line B-B', FIGS. 40 and 44 illustrate vertical cross-sectional views cut along a line C-C', and FIGS. 52 and 55 illustrate vertical cross-sectional views cut along a line H-H'.

Figure 25:
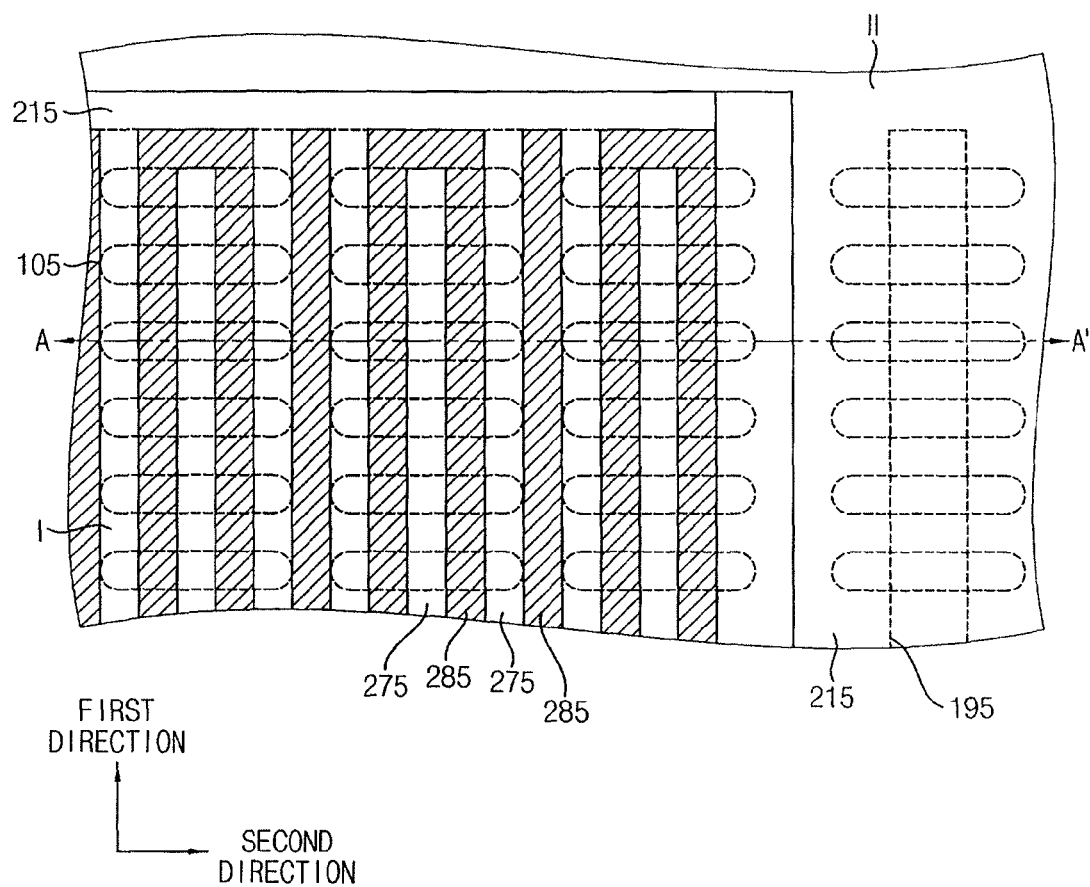
Figure 31:
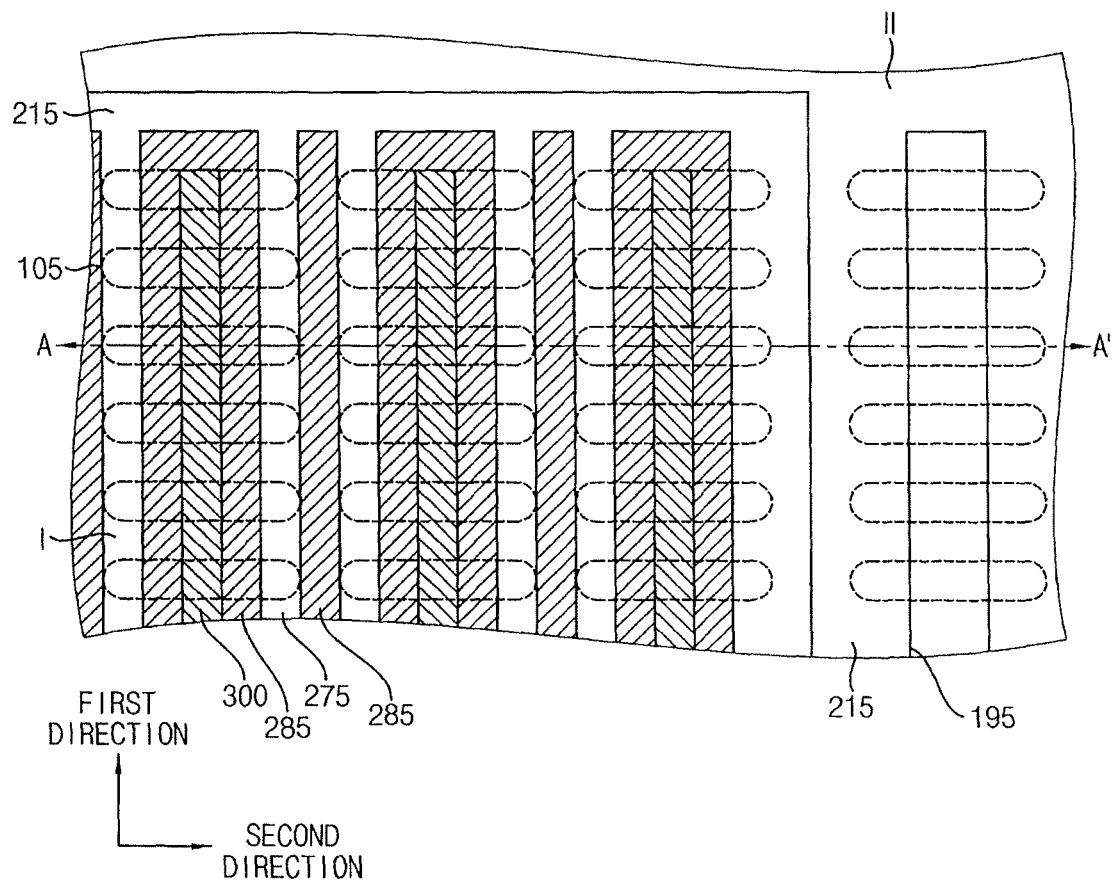
Figure 45:
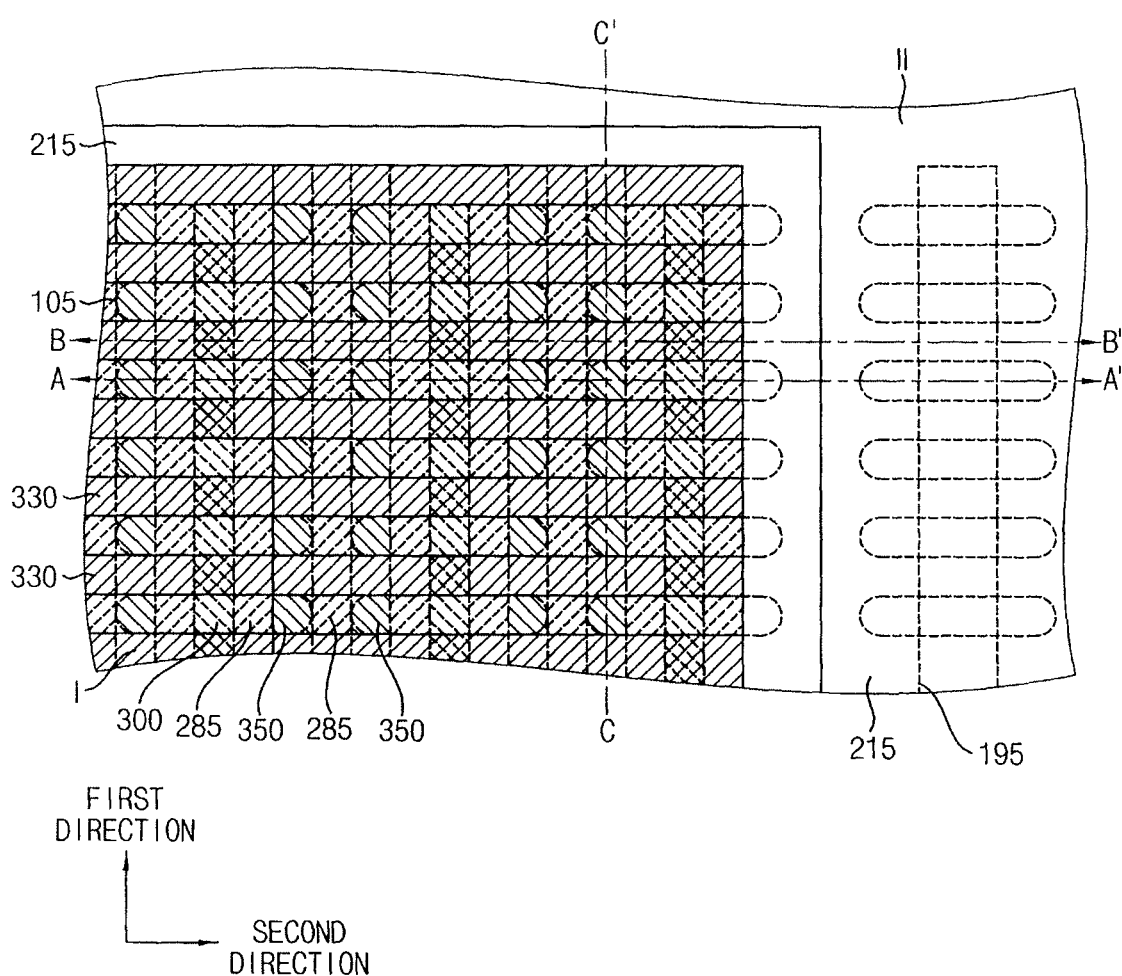
Figure 46:
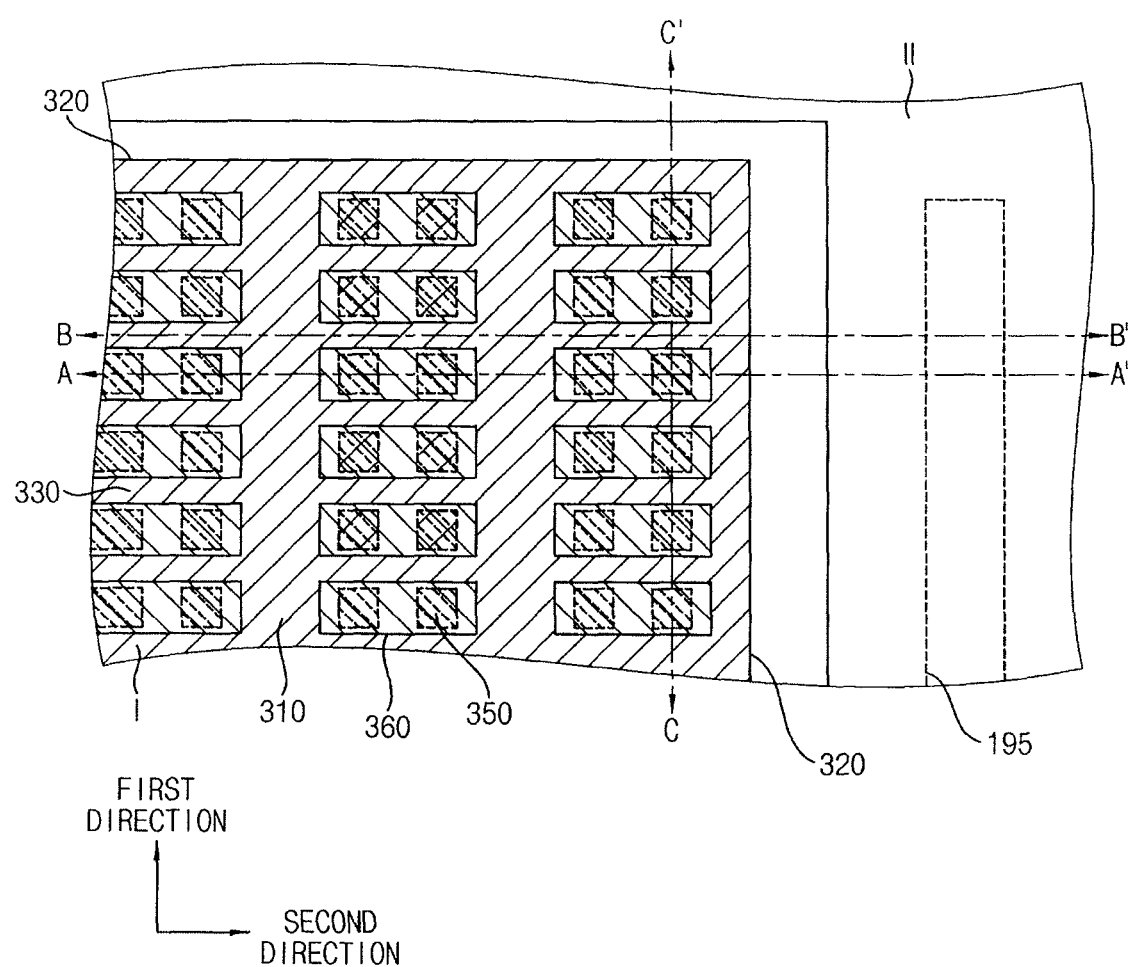

FIG. 25 illustrates a horizontal cross-sectional view cut along a line D-D', FIG. 29 illustrates a horizontal cross-sectional view cut along a line E-E', FIG. 31 illustrates a horizontal cross-sectional view cut along a line F-F', and FIG. 45 illustrates a horizontal cross-sectional view cut along a line G-G'.

Figure 2:
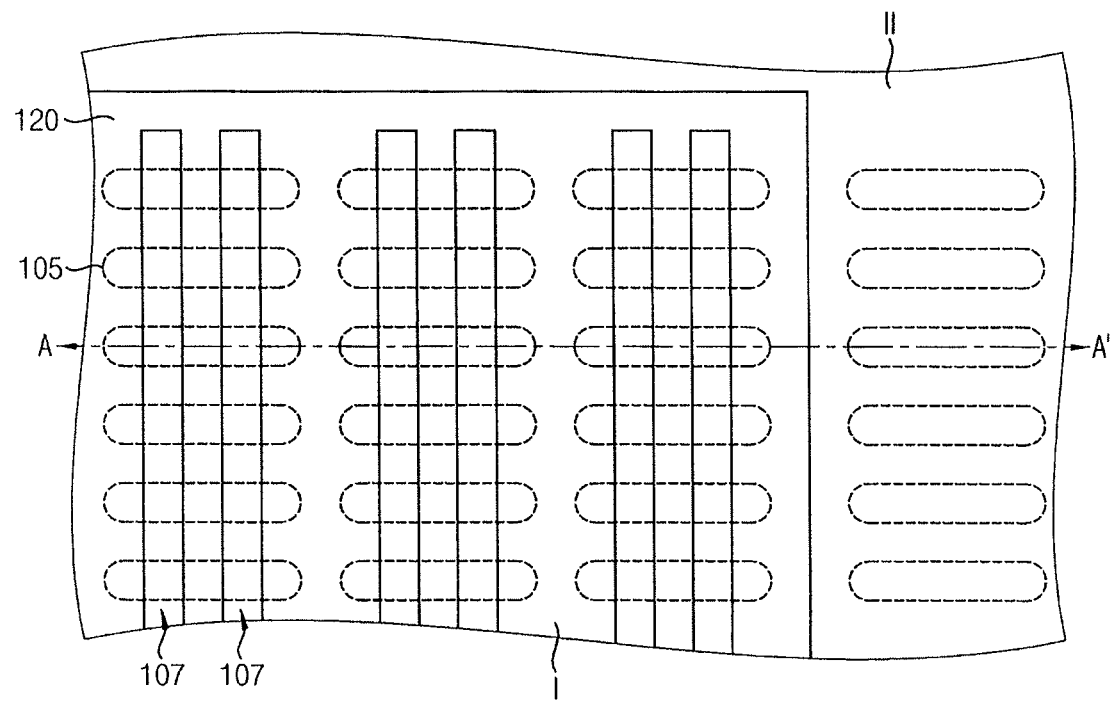
FIGS. 2, 5, 7, 10, 13, 16, 18, 20, 22, 27, 33, 35, 37, 41, 46, 48, 50, 53 and 56 illustrate plan views of the MRAM device.

Referring to FIGS. 1 and 2, impurities may be implanted into an upper portion of a substrate 100 in a first region I to form an impurity region 103. An isolation layer 110 may be formed on the substrate 100 to divide the substrate 100 into an active region 105 and a field region.

The substrate 100 may be a silicon substrate, a germanium substrate, a silicon-germanium substrate, a silicon-on-insulator (SOI) substrate, a germanium-on-insulator (GOI) substrate, etc. The substrate 100 may include the first region I in which memory cells may be formed, and a second region II in which peripheral circuits may be formed.

The impurities may include n-type impurities, e.g., phosphorous, arsenic, etc., or p-type impurities, e.g., boron, gallium, etc. The impurity region 103 may serve as source/drain regions of the memory cells.

The isolation layers 110 may be formed by a shallow trench isolation (STI) process. Particularly, after forming a first trench at an upper portion of the substrate 100, an insulation layer sufficiently filling the first trench may be formed on the substrate 100. An upper portion of the insulation layer may be planarized until a top surface of the substrate 100 may be exposed. The insulation layer may be formed by a chemical vapor deposition (CVD) process, a high density plasma chemical vapor deposition (HDP-CVD) process, etc. In an example embodiment, before forming the isolation layer 110, a liner may be formed on an inner wall of the first trench using a nitride.

Instead of forming the impurity region 103 before forming the isolation layer 110, the impurity region 103 may be formed after forming the isolation layer 110.

The substrate 100 may be partially removed to form a second trench 107.

In example embodiments, a first mask layer may be formed on the substrate 100. The first mask layer may be patterned by a photolithography process to form a first mask 120. An upper portion of the substrate 100 may be etched using the first mask 120 as an etching mask to form the second trench 107. In example embodiments, the second trench 107 may be formed to extend in a first direction substantially parallel to a top surface of the substrate 100. A plurality of second trenches 107 may be formed in a second direction substantially parallel to the top surface of the substrate 100 and substantially perpendicular to the first direction. In an example embodiment, two second trenches 107 may be formed within each active region 105 divided by the isolation layer 110. The first mask layer may be formed to include, e.g., silicon oxide.

Figure 3:
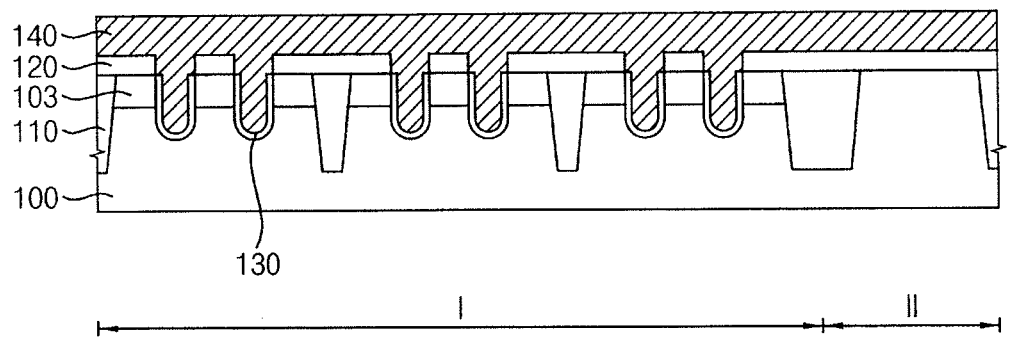

Referring to FIG. 3, a first gate insulation layer 130 may be formed on an inner wall of the second trench 107. A first gate electrode layer 140 may be formed on the first insulation layer 130 and the first mask 120 to sufficiently fill the second trench 107.

In example embodiments, the first gate insulation layer 130 may be formed by a thermal oxidation process or a radical oxidation process on an upper portion of the substrate 100 exposed by the second trench 107. In other example embodiments, the first gate insulation layer 130 may be formed by depositing a silicon oxide layer or a metal oxide layer on an inner wall of the second trench 107 and the first mask 120 through (e.g., a CVD process), and by removing a portion of the silicon oxide layer or the metal oxide layer on the first mask 120. The metal layer may be formed to include, e.g., hafnium oxide, tantalum oxide, zirconium oxide, etc.

The first gate electrode layer 140 may be formed to include a metal or a metal nitride, e.g., tungsten, titanium nitride, tantalum nitride, etc., and/or a metal silicide by an atomic layer deposition (ALD) process, a physical vapor deposition (PVD) process, etc.

Figure 4:
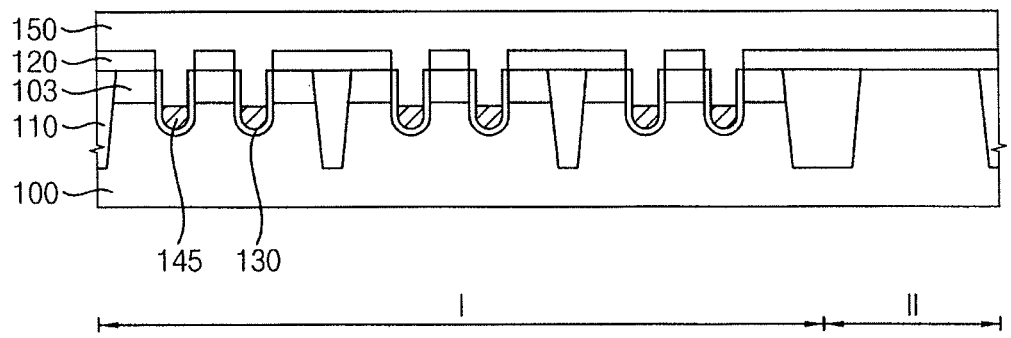
Figure 5:
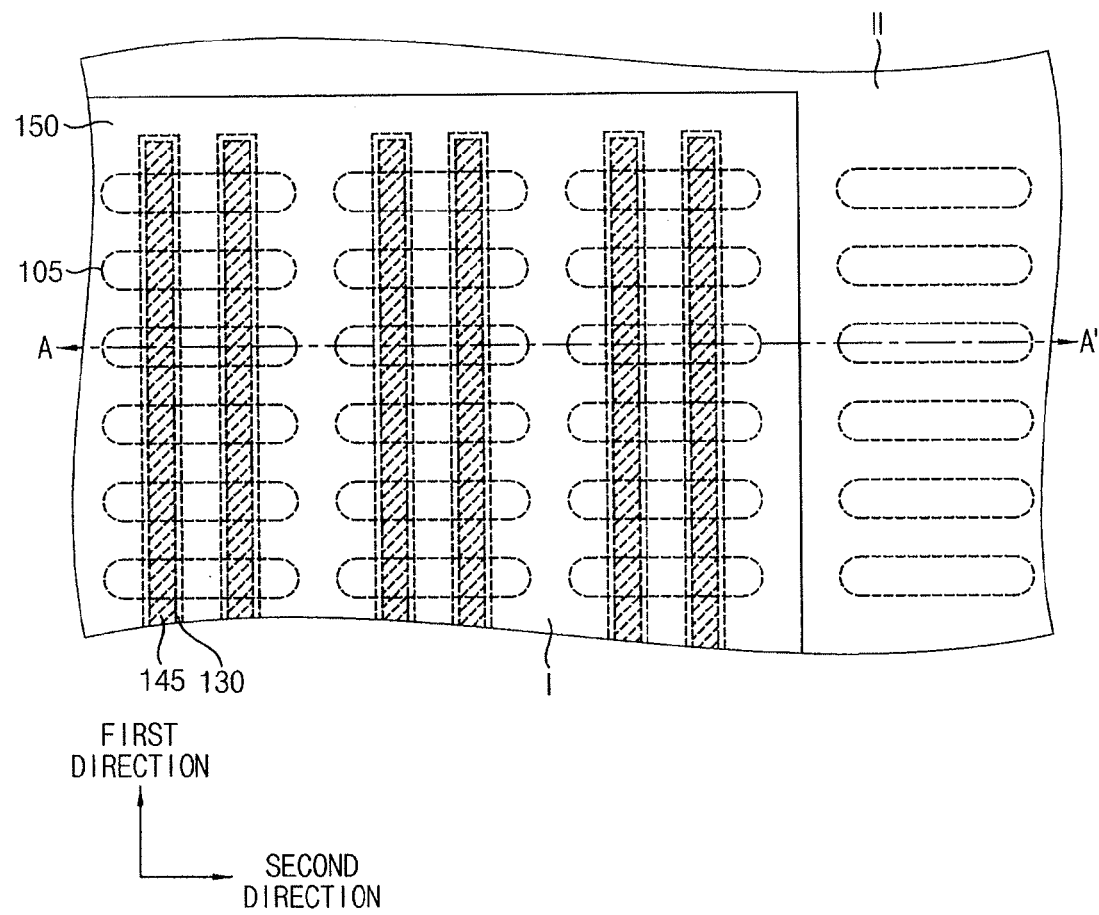

Referring to FIGS. 4 and 5, an upper portion of the first gate electrode layer 140 may be removed to form a first gate electrode 145 partially filling the second trench 107. A first capping layer 150 filling a remaining portion of the second trench 107 may be formed on the first gate electrode 145, the first gate insulation layer 130, and the first mask 120.

In example embodiments, an upper portion of the first gate electrode layer 140 may be planarized by, e.g., a chemical mechanical polishing (CMP) process and/or an etch back process. A portion of the first gate electrode layer 140 on the second trench 107 may be further removed by an anisotropic etching process to form the first gate electrode 145. Thus, the first gate electrode 145 may fill a lower portion of the second trench 107. In example embodiments, the first gate electrode 145 may extend in the first direction, and a plurality of first gate electrodes 145 may be formed in the second direction. The first capping layer 150 may be formed to include, e.g., silicon oxide, silicon nitride, etc.

Figure 6:
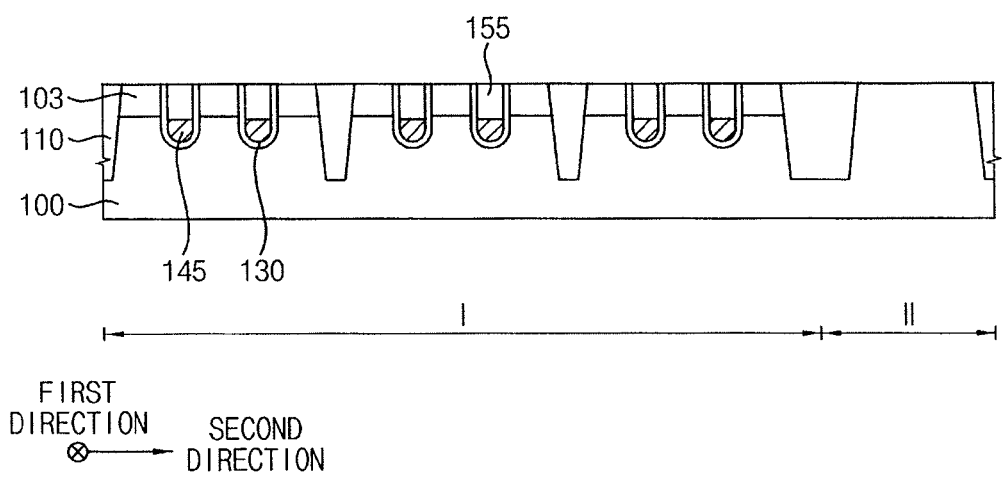
Figure 7:
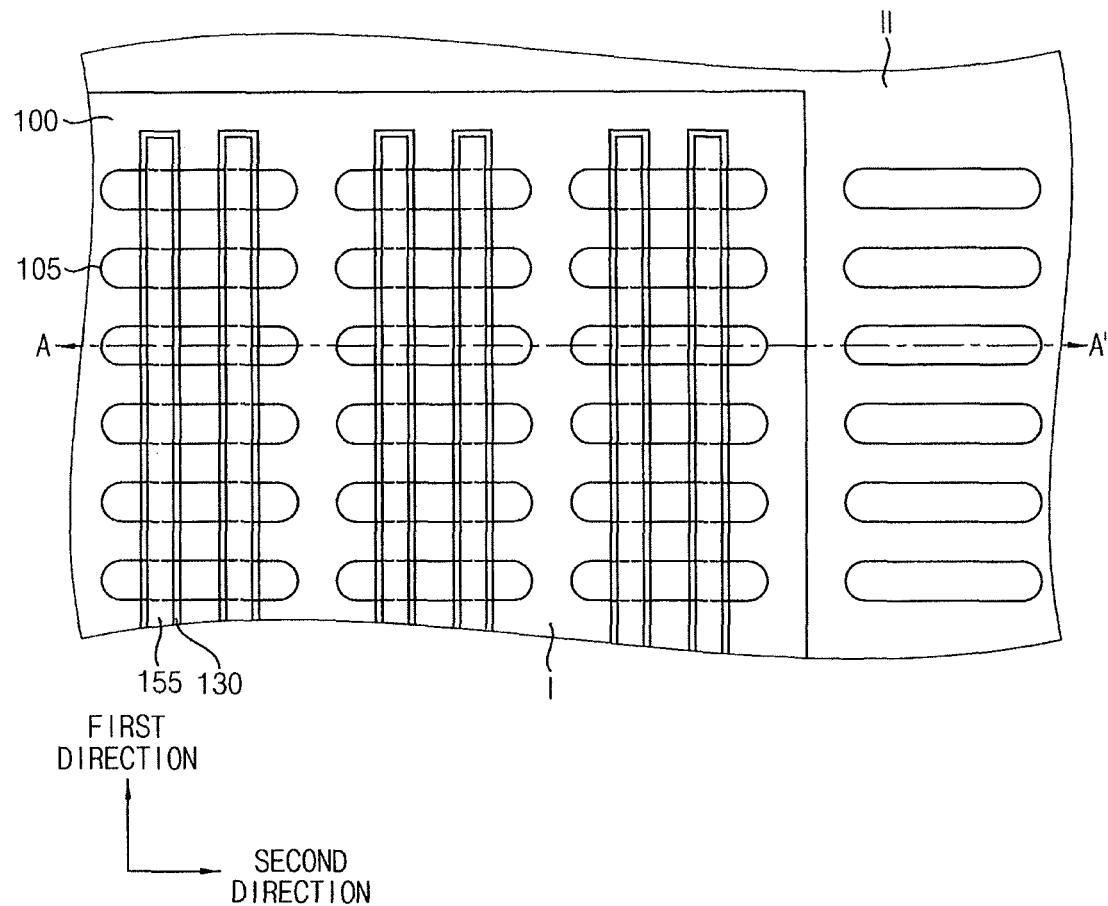

Referring to FIGS. 6 and 7, an upper portion of the first capping layer 150 and the first mask 120 may be removed until a top surface of the substrate 100 is exposed, by a CMP process and/or an etch back process, to form a first capping layer pattern 155. Thus, the first capping layer pattern 155 may fill an upper portion of the second trench 107. In example embodiments, the first capping layer pattern 155 may extend in the first direction, and a plurality of first capping layer patterns 155 may be formed in the second direction.

The first gate insulation layer 130, the first gate electrode 145, and the first capping layer pattern 155 may form a first gate structure. The first gate structure may be a buried gate structure filling the second trench 105. The first gate structure and the impurity region 103 may form a transistor.

Figure 8:
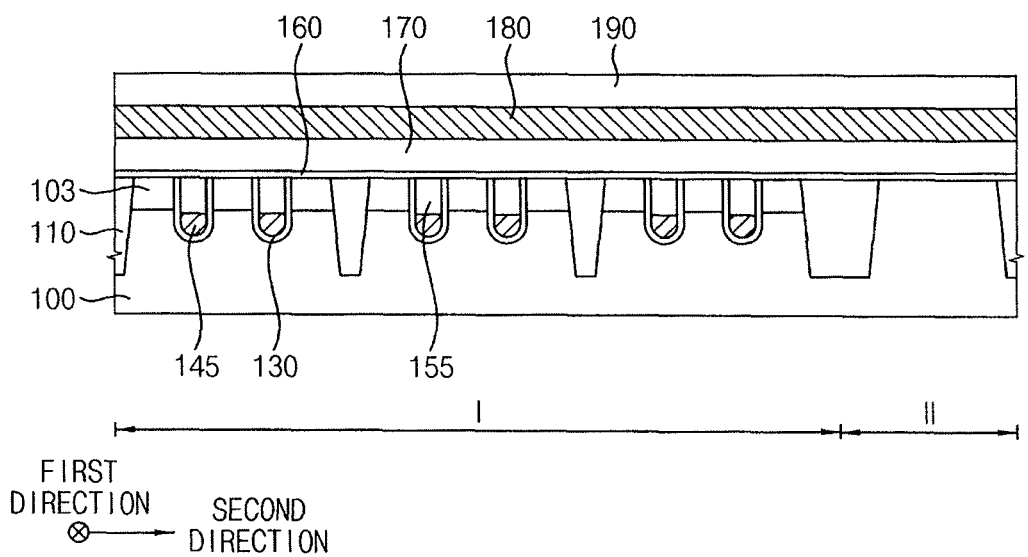

Referring to FIG. 8, a second gate insulation layer 160, a second gate electrode layer 170, a third gate electrode layer 180, and a second mask layer 190 may be sequentially formed on the first gate structure, substrate 100, and isolation layer 110.

The second gate insulation layer 160 may be formed to include, e.g., silicon oxide. The second gate electrode layer 170 may be formed to include, e.g., doped polysilicon. The third gate electrode layer 180 may be formed to include, e.g., a metal and/or a metal nitride. The second mask layer 190 may be formed to include, e.g., silicon nitride.

Figure 9:
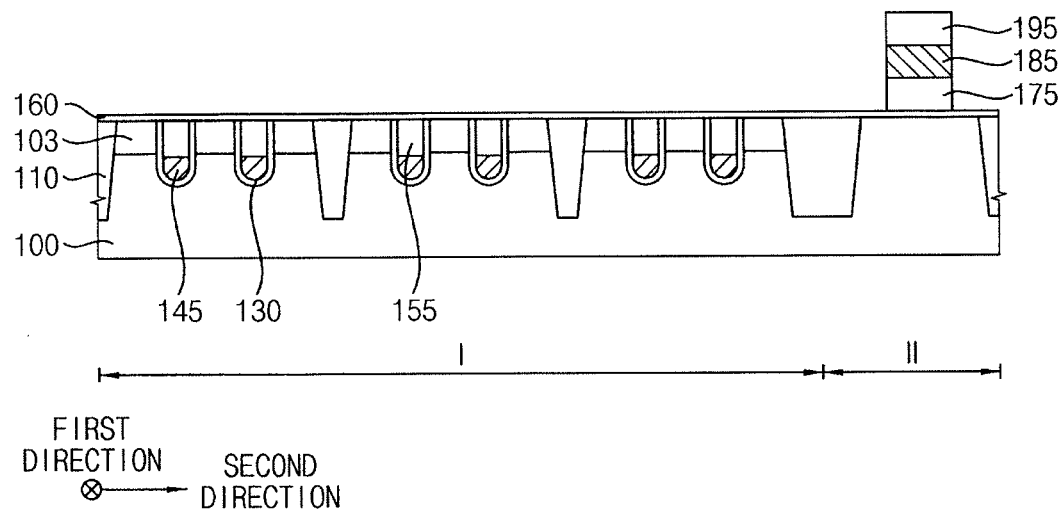
Figure 10:
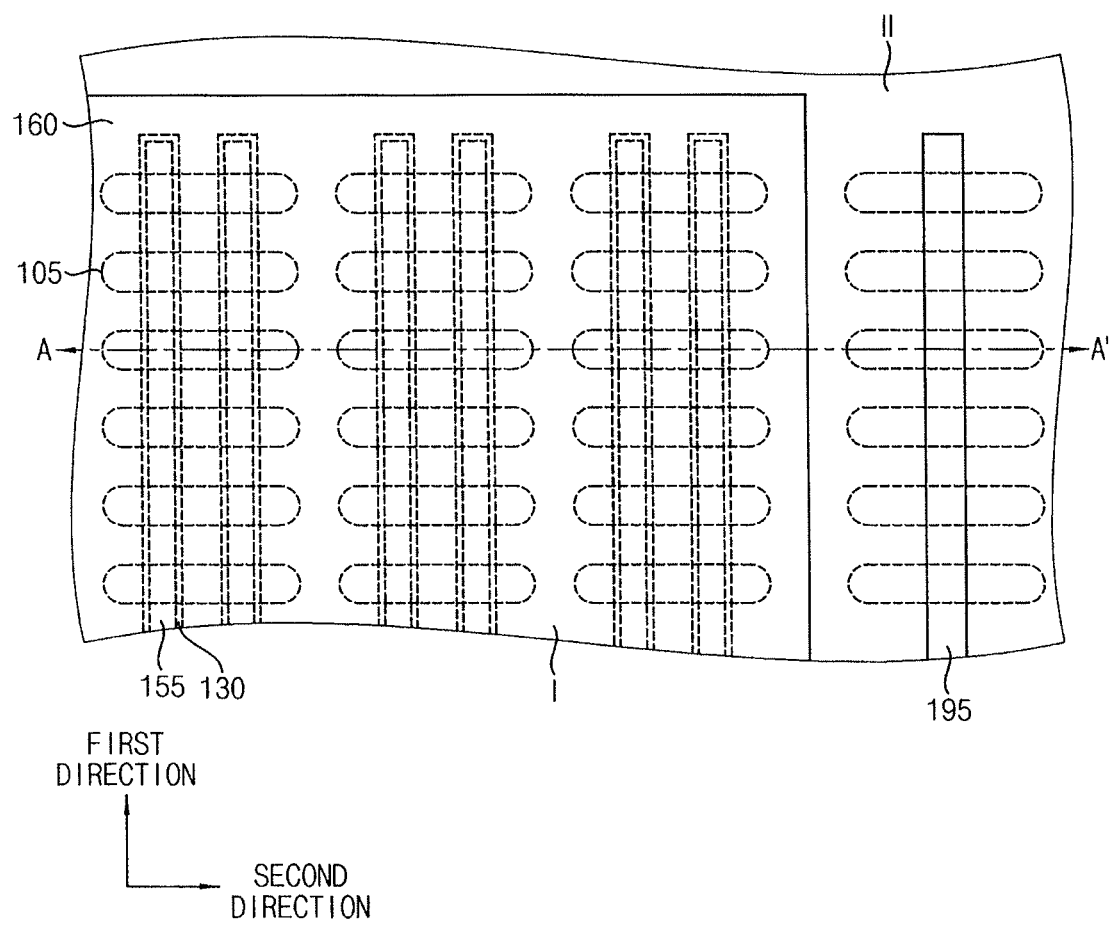

Referring to FIGS. 9 and 10, the second mask layer 190 may be patterned by a photolithography process to form a second mask 195 in the second region II. The third and second gate electrode layers 180 and 170 may be etched, using the second mask 195 as an etching mask, to form a third gate electrode 185 and a second gate electrode 175, respectively.

When the second and third gate electrodes 175 and 185 are formed, in example embodiments, the second gate insulation layer 160 may not be patterned but may remain on the substrate 100, the isolation layer 110 and the first gate structure. Alternatively, the second gate insulation layer 160 may be patterned together with the second and third gate electrode layers 170 and 180 to be removed from the first region I of the substrate 100.

The second gate insulation layer 160, the second gate electrode 175, the third gate electrode 185, and the second mask 195 sequentially stacked on the substrate 100 in the second region II may form a second gate structure. The second and third gate electrodes 175 and 185 and the second mask 195 may be referred to as a second gate electrode structure.

Figure 11:
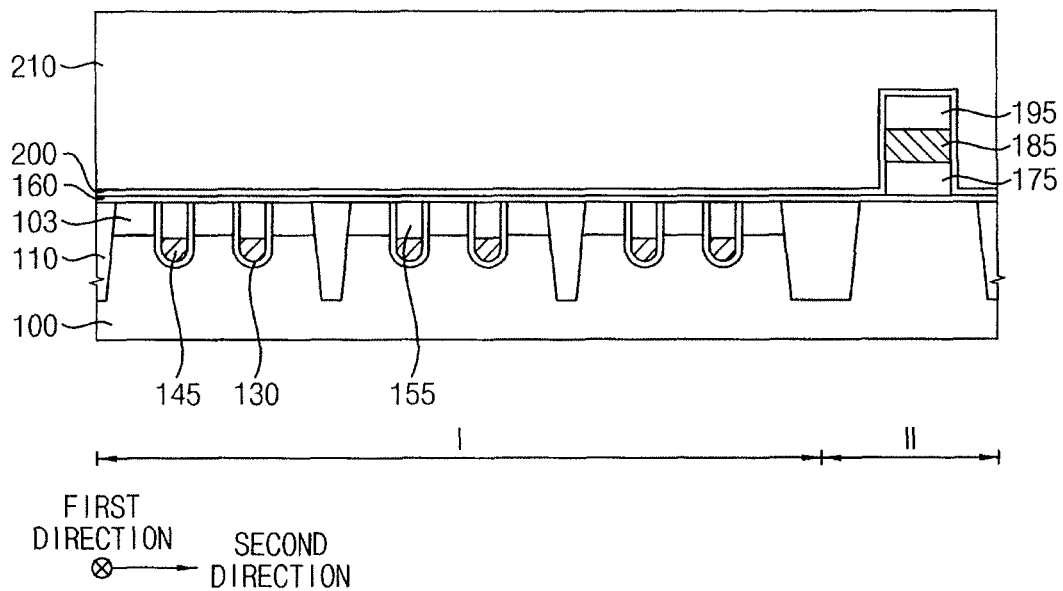

Referring to FIG. 11, an etch stop layer 200 may be formed on the second insulation layer 160 and the second gate electrode structure. A first insulating interlayer 210 may be formed on the etch stop layer 200 to have a top surface higher than that of the second gate electrode structure, so that the first insulating interlayer 210 may sufficiently cover the second gate electrode structure.

The etch stop layer 200 may be formed to include, e.g., silicon nitride. The first insulating interlayer 210 may be formed to include, e.g., silicon oxide. Thus, the etch stop layer 200 may include a material substantially the same as that of the second mask 195, thereby to be merged thereto. A portion of the first insulating interlayer 210 in the first region I may be removed in subsequent processes, and thus may serve as a sacrificial layer.

Figure 12:
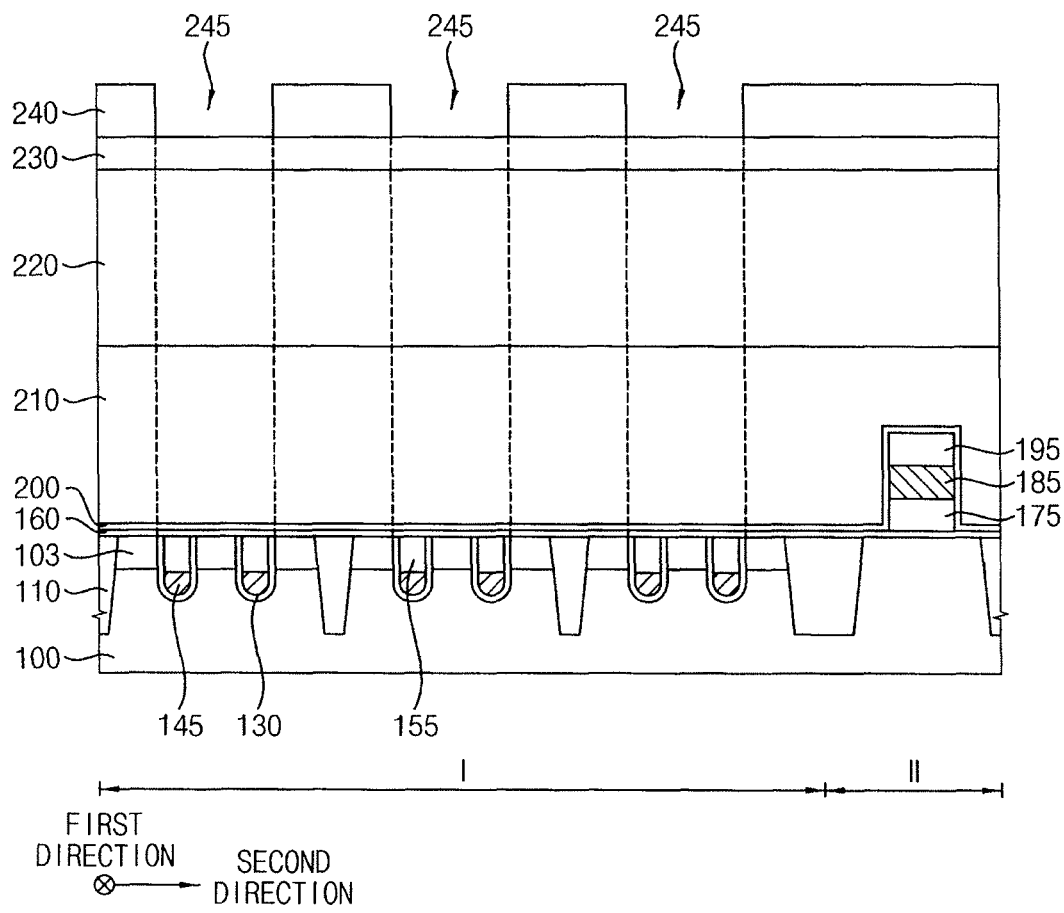
Figure 13:
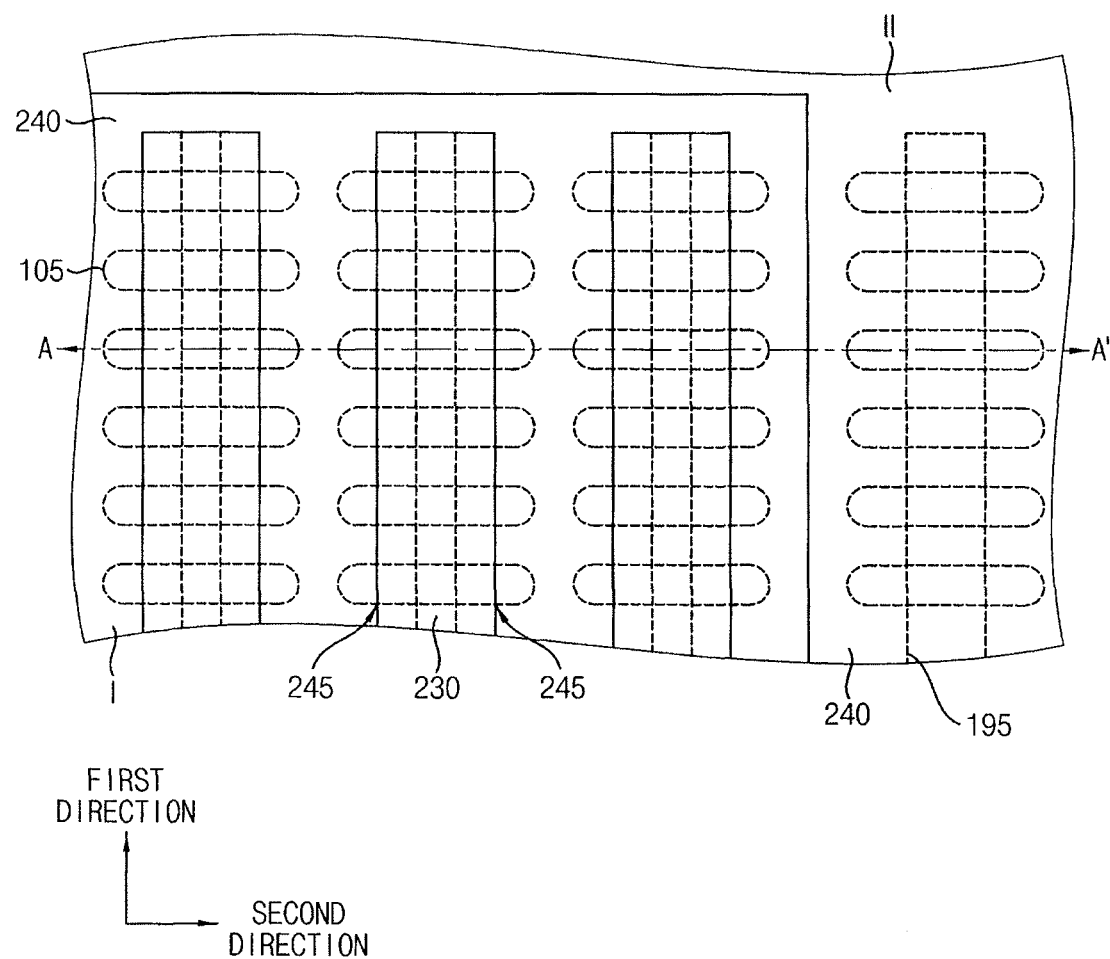

Referring to FIGS. 12 and 13, a silicon-on-hardmask (SOH) layer 220, an oxynitride layer 230, and a first photoresist pattern 240 may be sequentially formed on the first insulating interlayer 210.

The first photoresist pattern 240 may include a plurality of first openings 245, each of which may extend in the first direction, arranged in the second direction. In example embodiments, each first opening 245 may overlap two first gate structures adjacent to each other in each active region 105 and a portion of the substrate 100 therebetween.

Figure 14:
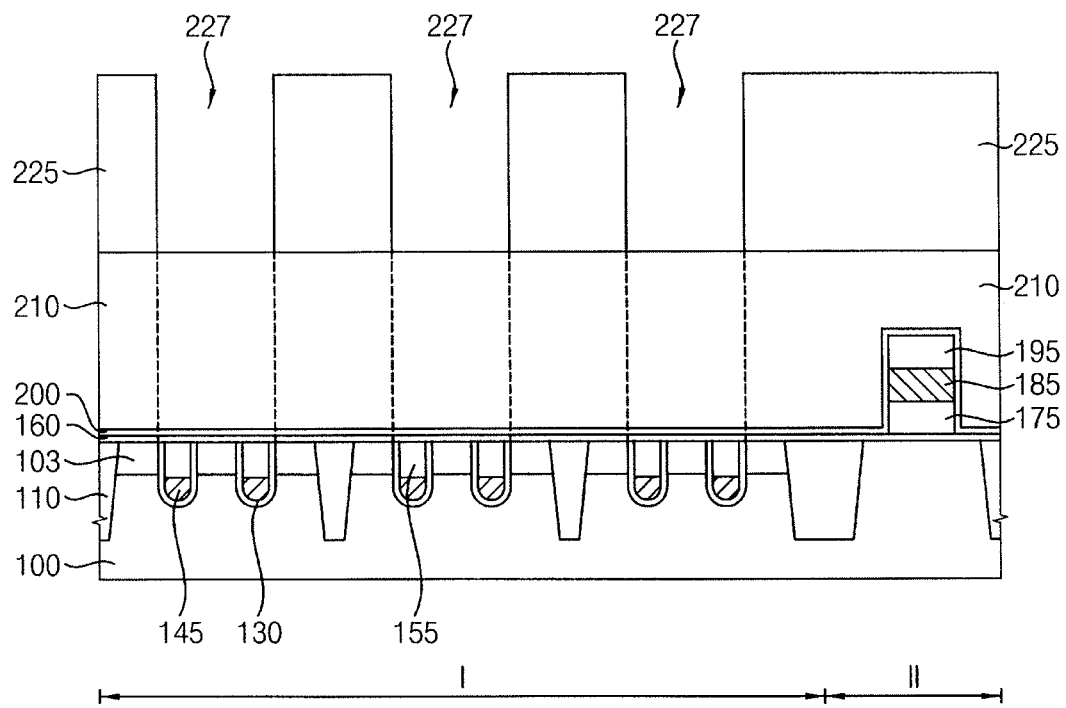

Referring to FIG. 14, the oxynitride layer 230 may be etched using the first photoresist pattern 240 as an etching mask to form an oxynitride layer pattern. The SOH layer 220 may be etched using the oxynitride layer pattern as an etching mask to form an SOH layer pattern 225. The SOH layer pattern 225 may include a plurality of second openings 227 exposing top surfaces of the first insulating interlayer 210.

Each second opening 227 may have a width in the second direction wider than that of the first gate structure. For example, the width of each second opening 227 in the second direction may be about 2.5 times to about 3 times the width of the first gate structure.

Additionally, a portion of the SOH layer pattern 225 between the second openings 227 may have a width in the second direction wider than that of the first gate structure. For example, the width of the portion of the SOH layer pattern 225 between the second openings 227 may be about 2.5 times to about 4 times the width of the first gate structure. Thus, the portion of the SOH layer pattern 225 between the second openings 227 may not have a high aspect ratio, and thus may not collapse. Additionally, a subsequent etching process (refer to FIGS. 15 and 16) may be properly performed using the SOH layer pattern 225 as an etching mask.

Figure 15:
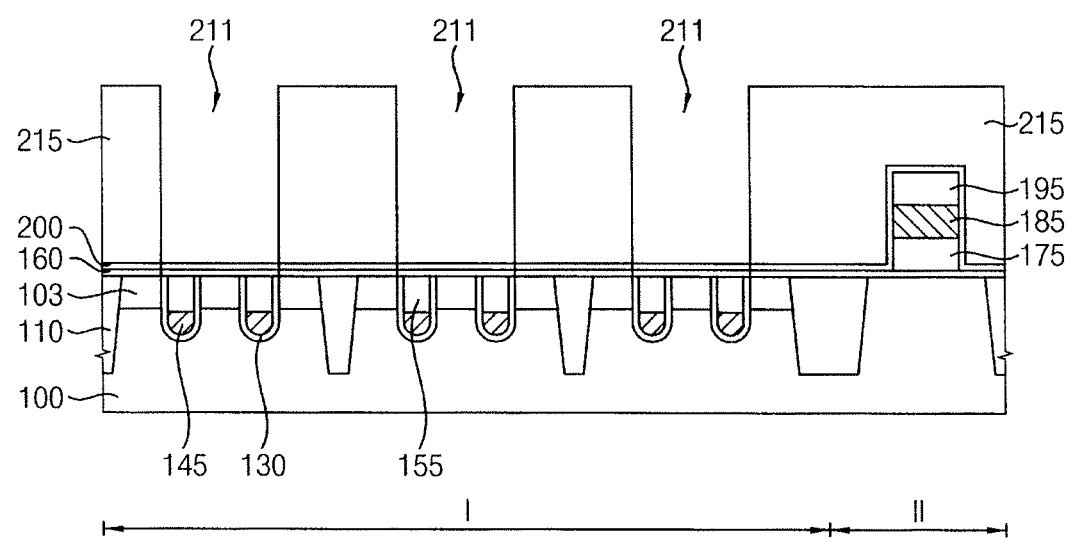
Figure 16:
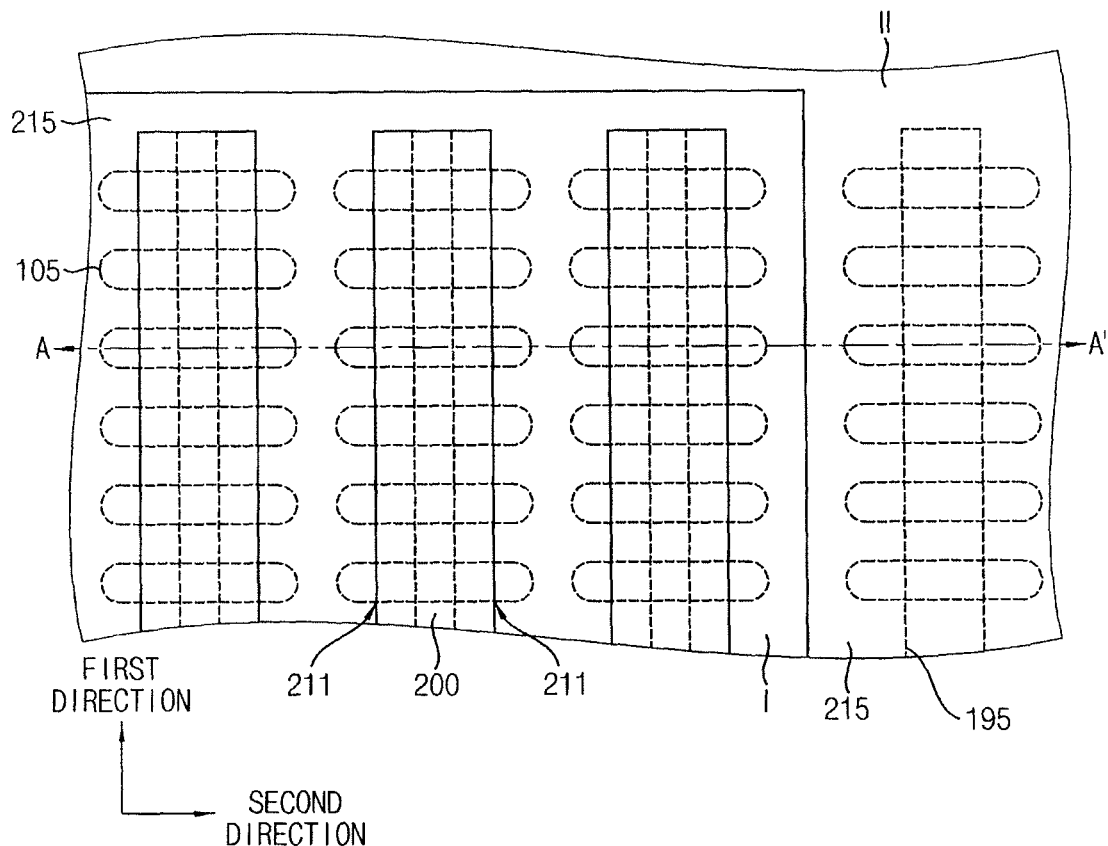

Referring to FIGS. 15 and 16, the first insulating interlayer 210 may be etched using the SOH layer pattern 225 as an etching mask to form a first insulating interlayer pattern 215. The etching process may be performed using the etch stop layer 200 under the first insulating interlayer 210 as an etching ending point. Thus, a plurality of third openings 211 through the first insulating interlayer pattern 215 may expose top surfaces of the etch stop layer 200. In example embodiments, each third opening 211 may overlap two first gate structures adjacent to each other in each active region 105 and the portion of the substrate 100 therebetween.

As described above, the portion of the first insulating interlayer pattern 215 in the first region I may be removed in a subsequent process (refer to FIGS. 19 and 20), and thus may be referred to as a sacrificial layer pattern 215.

Figure 17:
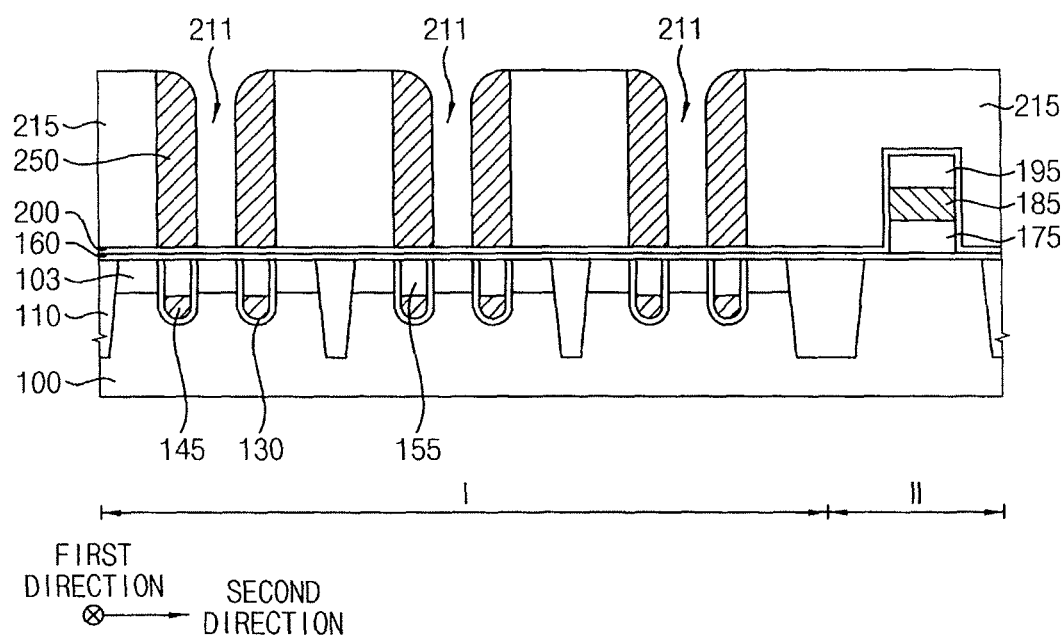
Figure 18:
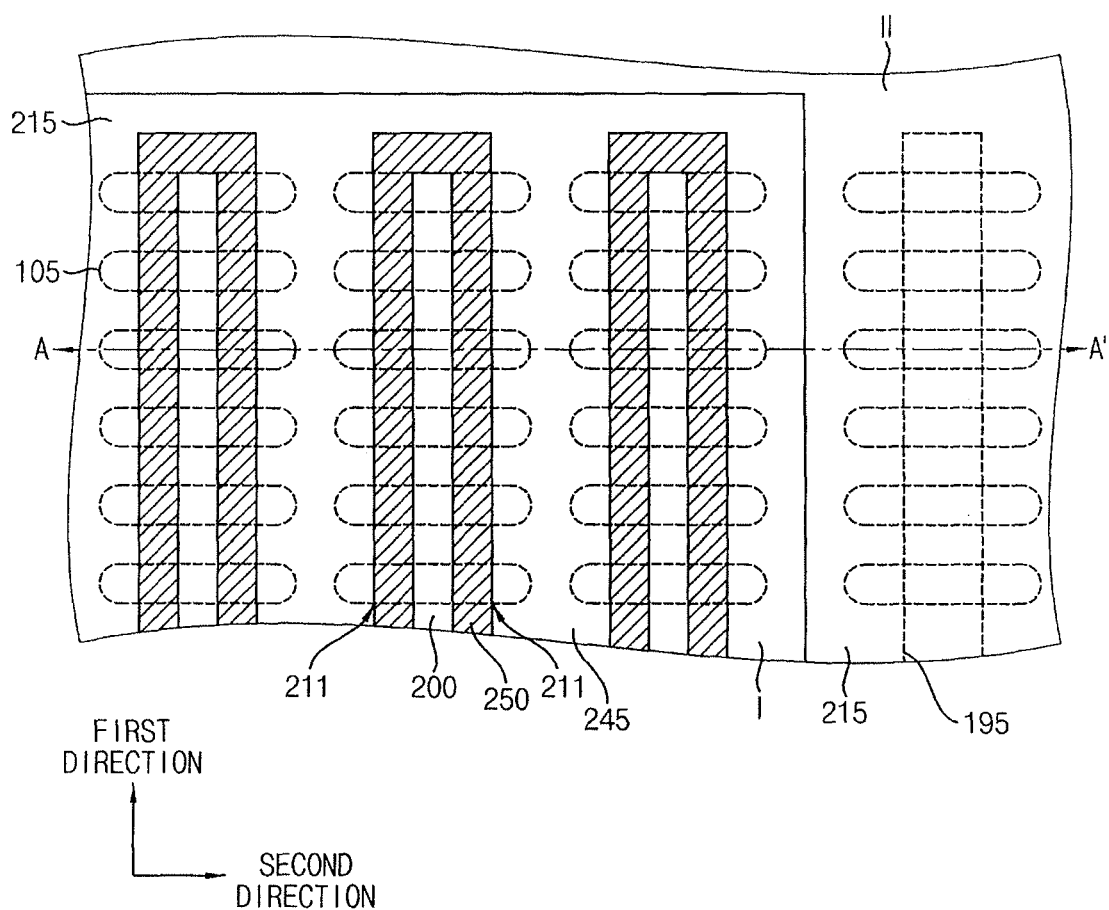

Referring to FIGS. 17 and 18, a first spacer 250 may be formed on a sidewall of each third opening 211. The first spacers 250 may be formed by forming a first spacer layer on the sidewalls of the third openings 211, the exposed top surfaces of the etch stop layer 200, and the sacrificial layer pattern 215. The first spacer layer may then be anisotropically etched. The first spacer layer may be formed to include, e.g., silicon nitride by an ALD process.

In example embodiments, each first spacer 250 may be formed to overlap the first gate structure. Portions of each first spacer 250 opposite to each other in each third opening 211 may be spaced by a first distance in the second direction. In an example embodiment, the first distance may be similar to the width of the first gate structure in the second direction.

When viewed from a top side, one first spacer 250 of a loop shape may be formed in each third opening 211. That is, each first spacer 250 may have first two portions, each of which may extend in the first direction, and second two portions connecting the first two portions. The first two portions of the first spacer 250 may be referred to as independent first spacers 250 for the convenience of explanation. Thus, the first spacers 250 in each third opening 211 may be spaced from each other by the first distance in the second direction.

Figure 19:
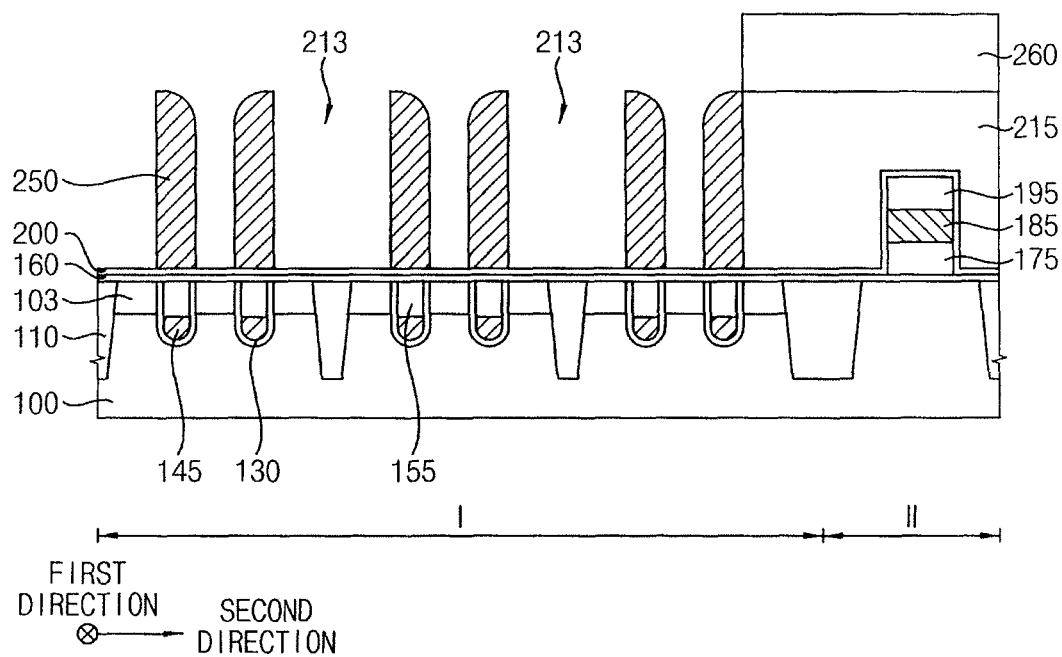
Figure 20:
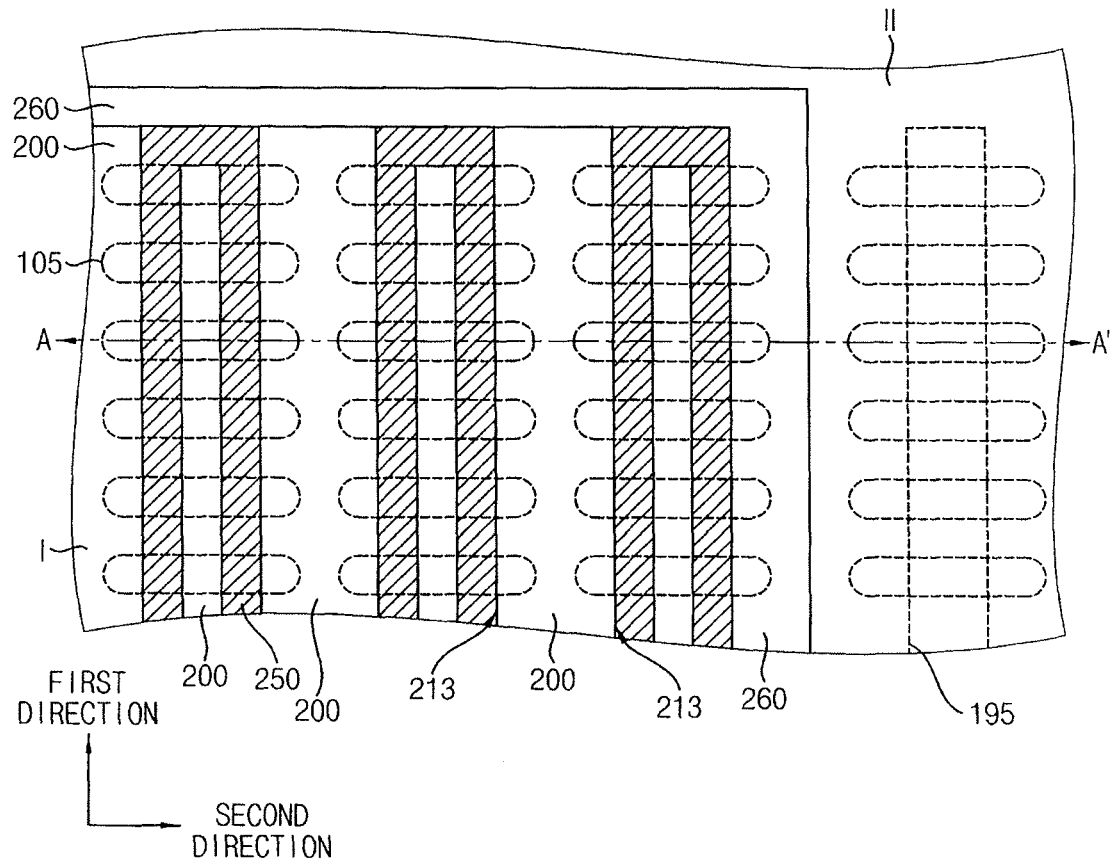

Referring to FIGS. 19 and 20, a third mask 260 may be formed on the sacrificial layer pattern 215. A portion of the sacrificial layer pattern 215 not covered by the third mask 260 may be removed to form a plurality of fourth openings 213 exposing top surfaces of the etch stop layer 200.

In example embodiments, the third mask 260 may be formed to cover the entire portion of the sacrificial layer pattern 215 in the second region II and a portion of the sacrificial layer pattern 215 in the first region I adjacent to the second region II. A central portion of the sacrificial layer pattern 215 in the first region I may be exposed. In an example embodiment, the third mask 260 may be formed to cover the second region II and portions of the sacrificial layer pattern 215 in the first region I that are formed at outer sides of outermost ones of the first spacers 250.

In example embodiments, the portion of the sacrificial layer pattern 215 not covered by the third mask 260 may be removed by a wet etching process using hydrofluoric acid as an etching solution.

Accordingly, as the portion of the sacrificial layer pattern 215 in the first region I is removed, the first spacers 250 may be spaced from each other by a second distance. The second distance may correspond to a width of the sacrificial layer pattern 215 in the second direction. That is, the first spacers 250 may be spaced from each other by the second distance through the fourth opening 213. In an example embodiment, the second distance may be about 2.5 times to about 4 times the width of the first gate structure in the second direction, and thus may be larger than the first distance.

As a result, the first spacers 250 disposed in the second direction may be spaced from one another by the first distance or the second distance. Particularly, when counted from the outermost one of the first spacers 250, a distance from odd numbered first spacers 250 to neighboring even numbered first spacers 250 may be the first distance. A distance from the even numbered first spacers 250 to the neighboring odd numbered first spacers 250 may be the second distance.

Figure 21:
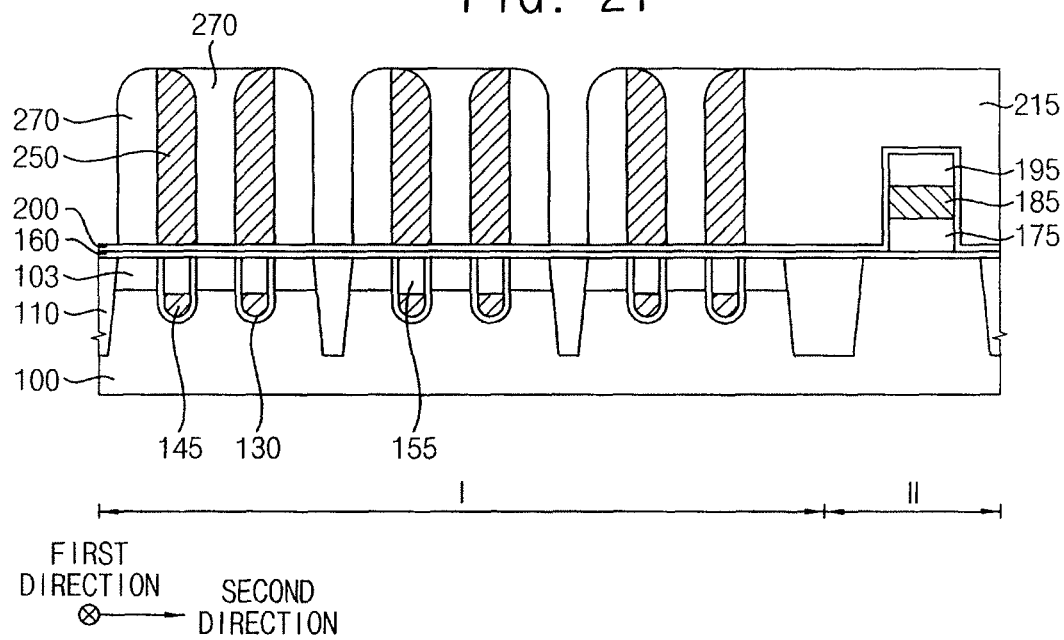
Figure 22:
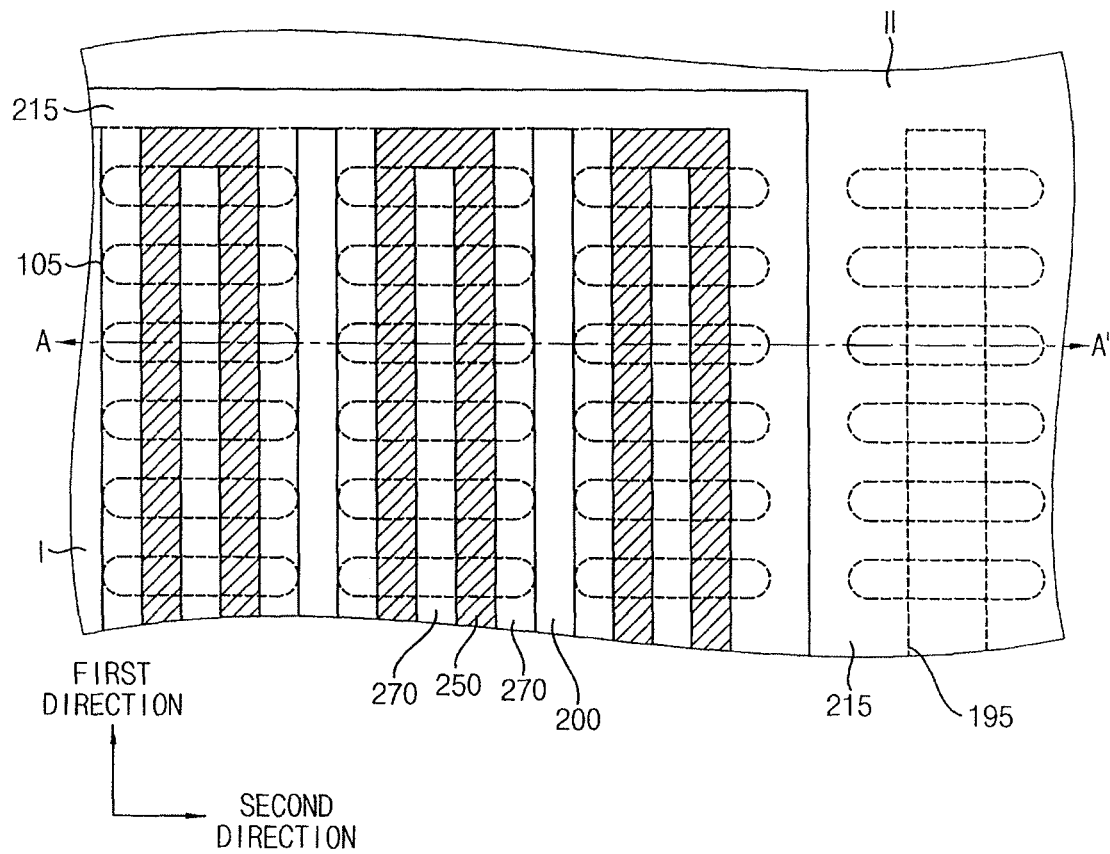

Referring to FIGS. 21 and 22, after removing the third mask 260, second spacers 270 contacting the first spacers 250 may be formed on the substrate 100. In example embodiments, the second spacers 270 may be formed by forming a second spacer layer covering the first spacers 250 on the etch stop layer 200 and the sacrificial layer pattern 215, and anisotropically etching the second spacer layer.

The second spacer layer may be formed to include, e.g., silicon oxide. Thus, a portion of the second spacer layer contacting the sacrificial layer pattern 215 may be merged thereto. In example embodiments, the second spacer layer may be formed by an ALD process.

In example embodiments, the second spacer layer may fill spaces between the first spacers 250 spaced from each other by the first distance. The second spacer layer may also partially fill spaces and partially cover a portion of the etch stop layer 200 between the first spacers 250 spaced apart from each other by the second distance.

Figure 23:
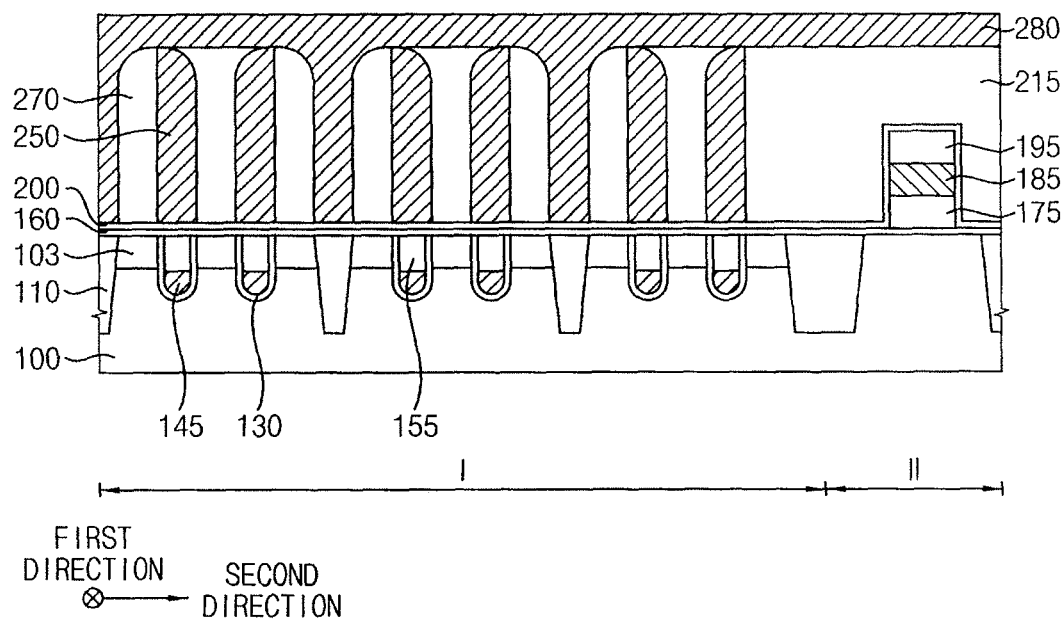

Referring to FIG. 23, a filling layer 280 may be formed on the etch stop layer 200, the first and second spacers 250 and 270, and the sacrificial layer pattern 215 to sufficiently fill the spaces between the second spacers 270, i.e., remaining portions of the fourth openings 213. In example embodiments, the filling layer 280 may be formed to include a material substantially the same as that of the first spacers 250, e.g., silicon nitride by an ALD process or a CVD process.

Figure 24:
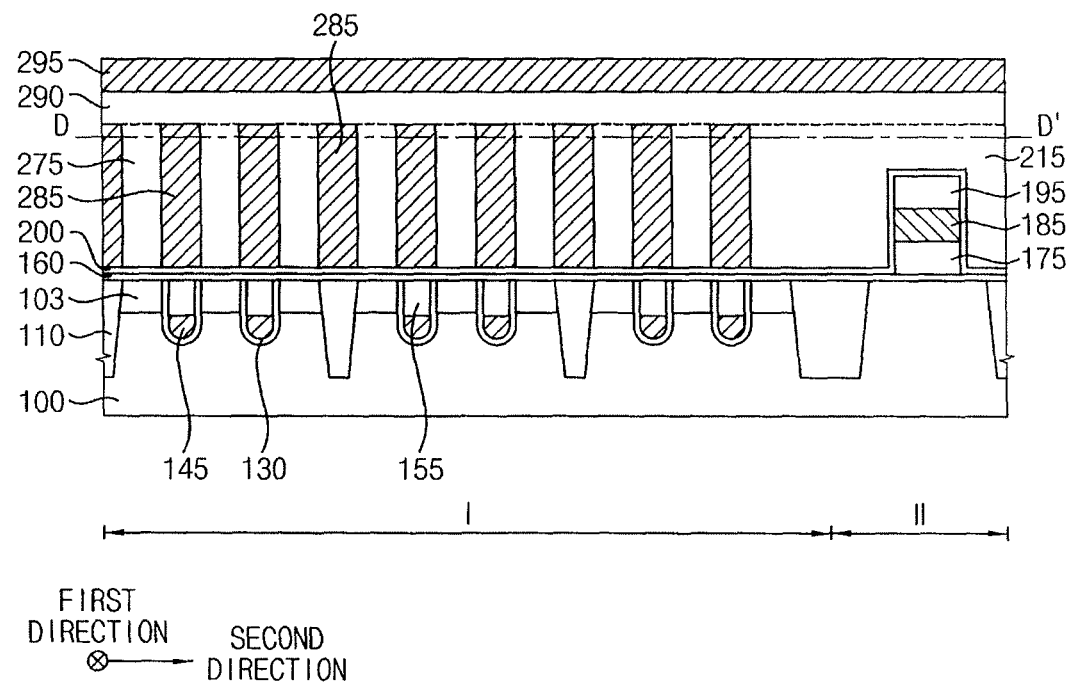

Referring to FIGS. 24 and 25, upper portions of the filling layer 280, the first and second spacers 250 and 270, and the sacrificial layer pattern 215 may be planarized to form first and second patterns 285 and 275. A second capping layer 290 and a third capping layer 295 may be sequentially formed on the first and second patterns 285 and 275 and the sacrificial layer pattern 215.

In example embodiments, the planarization process may be performed by a CMP process and/or an etch back process. By the planarization process, the first spacers 250 and the filling layer 280 may be converted into the first patterns 285. The second spacers 270 may be converted into the second patterns 275. Thus, each of the first and second patterns 285 and 275 may extend in the first direction. The first and second patterns 285 and 275 may be alternately and repeatedly formed in the second direction. The first and second patterns 285 and 275 may contact each other.

In example embodiments, some of the first patterns 285 may overlap the first gate structure. Others of the first patterns 285 may overlap the isolation layer 110. In example embodiments, the second patterns 275 may overlap the impurity region 103 adjacent to the first gate structure.

The first patterns 285 may include, e.g., silicon nitride. The second patterns 275 may include, e.g., silicon oxide. The second capping layer 290 may be formed to include, e.g., silicon nitride, thereby being merged into the first patterns 285. The third capping layer 295 may be formed to include, e.g., silicon nitride.

Figure 26:
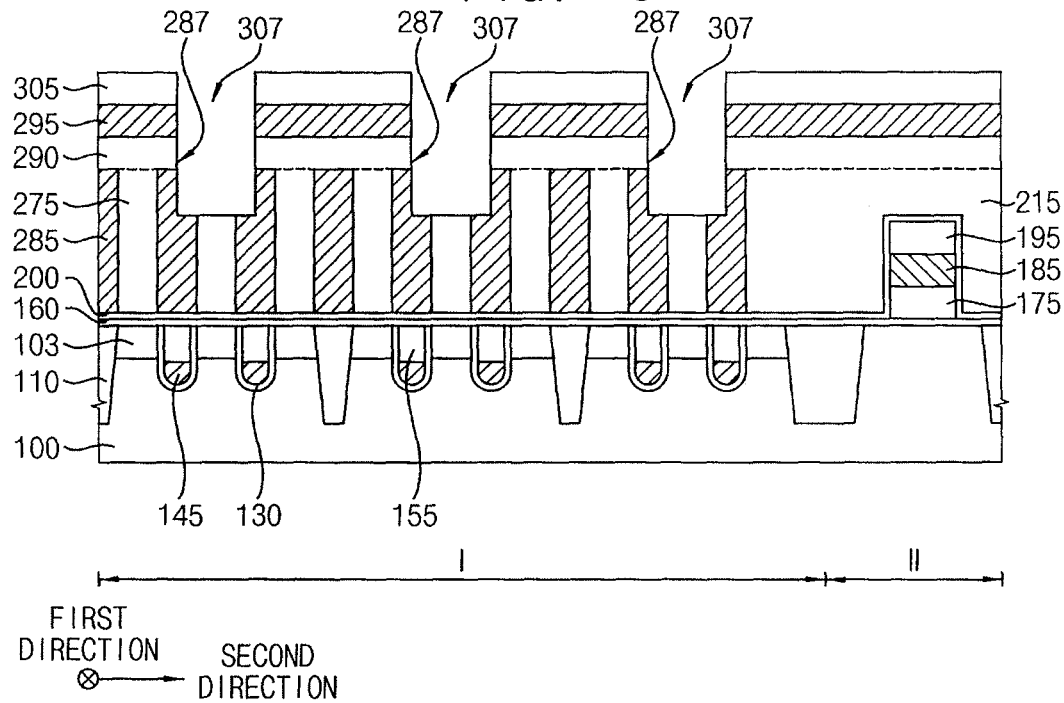
Figure 27:
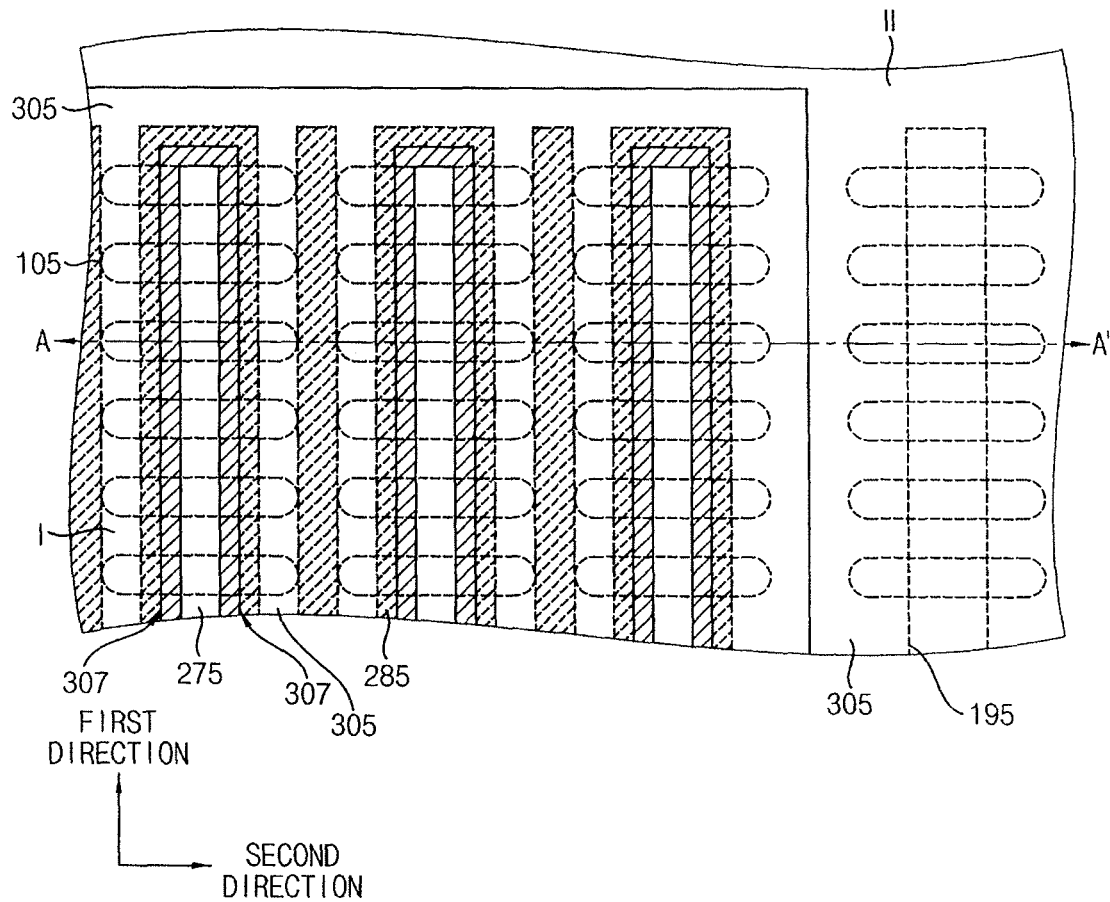

Referring to FIGS. 26 and 27, a second photoresist pattern 305 may be formed on the third capping layer 295. The third capping layer 295, the second capping layer 290, and upper portions of the first and second patterns 285 and 275 may be etched using the second photoresist pattern 305 as an etching mask to form recesses 287.

In example embodiments, the second photoresist pattern 305 may include a plurality of fifth openings 307, each of which may extend in the first direction, disposed in the second direction. Each fifth opening 307 may overlap the second pattern 275 on a portion of the substrate 100 between the first gate structures adjacent to each other and a portion of the first patterns 285 adjacent to the second pattern 275 in each active region 105. Thus, $(3n-2)^{th}$ second patterns 275, e.g., first, fourth and seventh second patterns 275, may be exposed by recesses 287 when counted from an outermost one of the second patterns 275. Here, n indicates a positive integer. In example embodiments, the etching process may be performed by a dry etching process.

Referring to FIGS. 28 and 29, after removing the second photoresist pattern 305, an etch stop layer pattern 309 may be formed on sidewalls of the second and third capping layers 290 and 295 and upper sidewalls of the first patterns 285 exposed by each recess 287. The etch stop layer patterns 309 may be formed by forming an etch stop layer on inner walls of the recesses 287 and the third capping layer 295, and anisotropically etching the etch stop layer. Thus, the etch stop layer patterns 309 may cover at least the sidewalls of the second capping layer 290.

The etch stop layer patterns 309 may be formed to include a material substantially the same as that of the first patterns 285 or the third capping layer 295, e.g., silicon nitride, thereby being merged thereto. The etch stop layer patterns 309 may include a material different from that of the second patterns 275 or the second capping layer 290, e.g., silicon nitride having a high etching selectivity with respect to the second patterns 275 or the second capping layer 290. The second capping layer 290 may therefore be prevented from being etched when a wet etching process for the second patterns 275 is subsequently performed.

The second patterns 275 exposed by the recesses 287 may be removed. Portions of the etch stop layer 200 and the second gate insulation layer 160 thereunder may be removed to form sixth openings 217, The sixth openings 217 may expose upper portions of the substrate 100 and may be in fluid communication with the recesses 287, respectively.

In example embodiments, the exposed second patterns 275 may be removed by a wet etching process using hydrofluoric acid as an etching solution. Portions of the etch stop layer 200 and the second gate insulation layer 160 may be removed by a dry etching process. (Each sixth opening 217 may be formed to extend in the first direction. The sixth opening 217 and the recess 287 in fluid communication therewith may be often referred to simply as a seventh opening for convenience of explanation).

Figure 30:
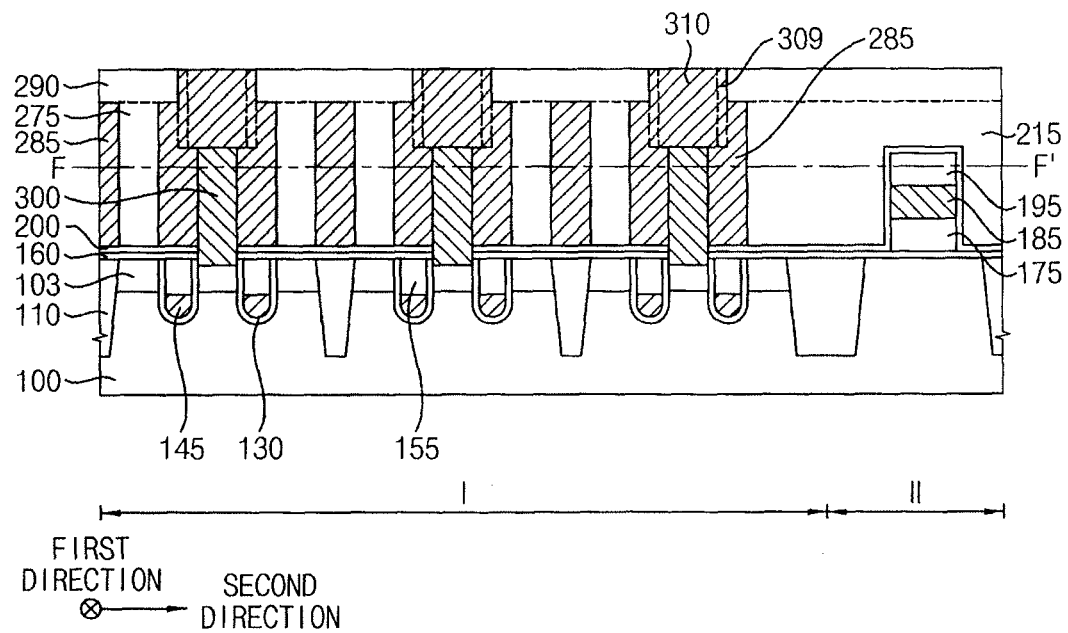

Referring to FIGS. 30 and 31, a source line 300 and a fourth capping layer pattern 310 filling lower and upper portions of each seventh opening, respectively, may be formed. That is, the source line 300 may be formed to fill each sixth opening 217, and the fourth capping layer pattern 310 may be formed to fill each recess 287.

The source lines 300 may be formed by forming a first conductive layer on the exposed upper portions of the substrate 100 to fill the sixth openings 217 and the recesses 287. Then, an upper portion of the first conductive layer may be removed. In example embodiments, portions of the first conductive layer in the recesses 287 may be completely removed, so that each source line 300 may be formed to fill only each sixth opening 217. Alternatively, the portions of the first conductive layer in the recesses 287 may be partially removed, so that each source line 300 may be formed to fill each sixth opening 217 and a lower portion of each recess 287. The first conductive layer may be formed to include a metal, e.g., tungsten, titanium, tantalum, etc., and/or a metal nitride, e.g., tungsten nitride, titanium nitride, tantalum nitride, etc.

Each source line 300 may extend in the first direction. A plurality of source lines 300 may be formed in the second direction. In example embodiments, each source line 300 may be formed on portions of the substrate 100 and the isolation layer 110 between neighboring first gate structures.

The fourth capping layer patterns 310 may be formed by forming a fourth capping layer on the source lines 300, the etch stop layer patterns 309, and the third capping layer 295 to fill the recesses 287. An upper portion of the fourth capping layer and the third capping layer 295 may then be planarized.

In example embodiments, the planarization process may be performed until a top surface of the second capping layer 290 is exposed. Thus, the third capping layer 295 may be removed. The fourth capping layer may be formed to include, e.g., silicon nitride, thereby being merged into the first patterns 285 and/or the etch stop layer patterns 309.

Figure 32:
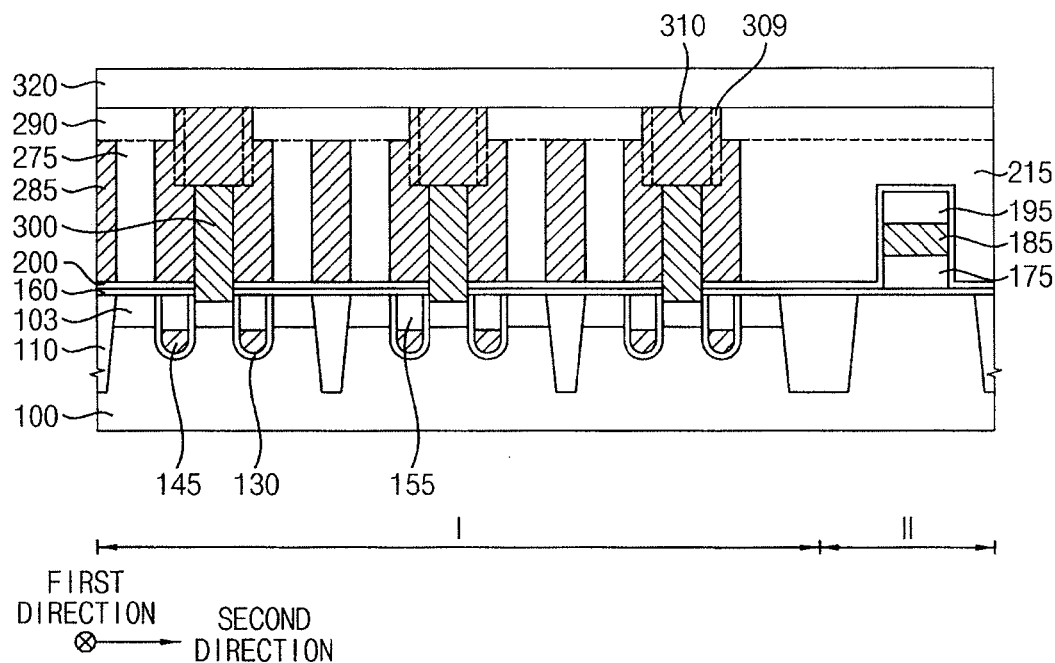
Figure 33:
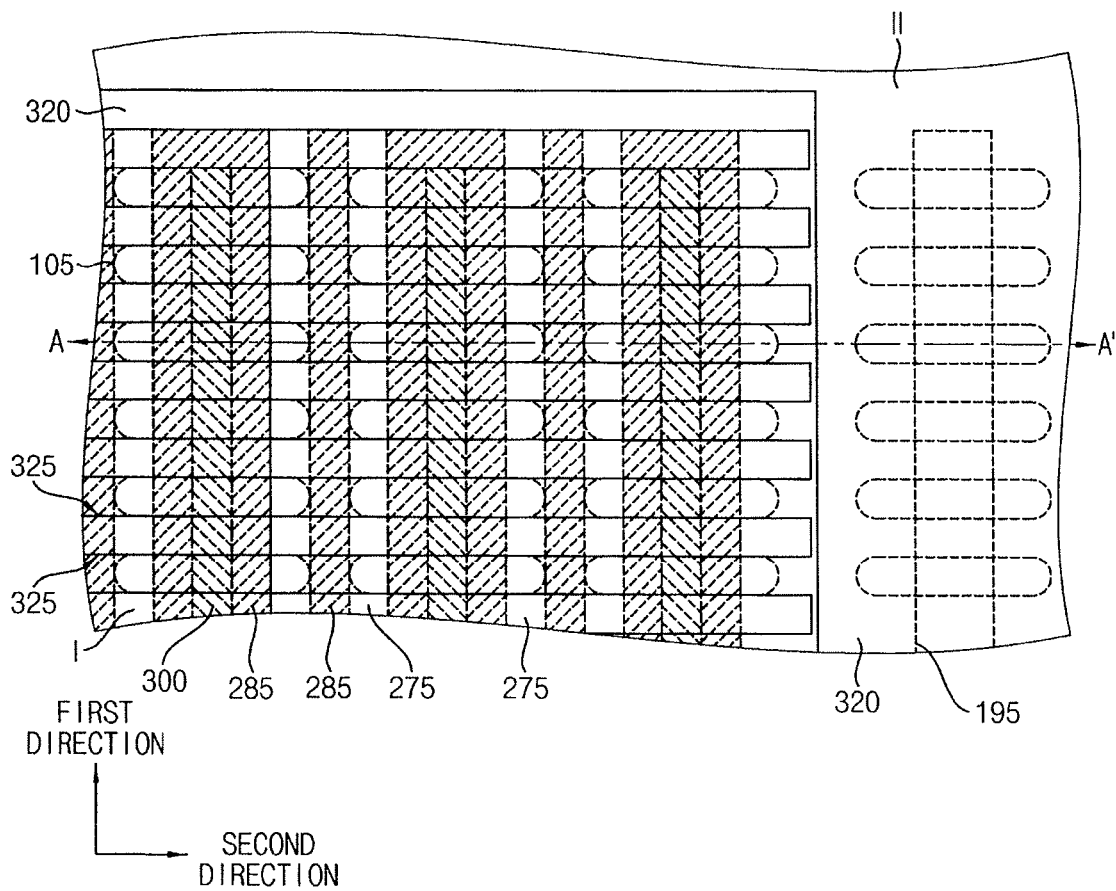

Referring to FIGS. 32 and 33, a fourth mask 320 may be formed on the second capping layer 290, the fourth capping layer pattern 310, the etch stop layer patterns 309, and the sacrificial layer pattern 215. In example embodiments, the fourth mask 320 may include a plurality of eighth openings 325, each of which may extend in the second direction, disposed in the first direction. Each eighth opening 325 may be formed in the first region I, and may partially expose the second capping layer 290, the fourth capping layer patterns 310, the etch stop layer patterns 309, and the sacrificial layer pattern 215. In example embodiments, each eighth opening 325 may be formed to overlap the field region of the substrate 100, i.e., overlap the isolation layer 110.

In example embodiments, the fourth mask 320 having a minute width may be formed by double patterning technology (DPT). The fourth mask 320 may be formed to include a material having an etching selectivity with respect to both of silicon nitride and silicon oxide, e.g., polysilicon.

Figure 34:
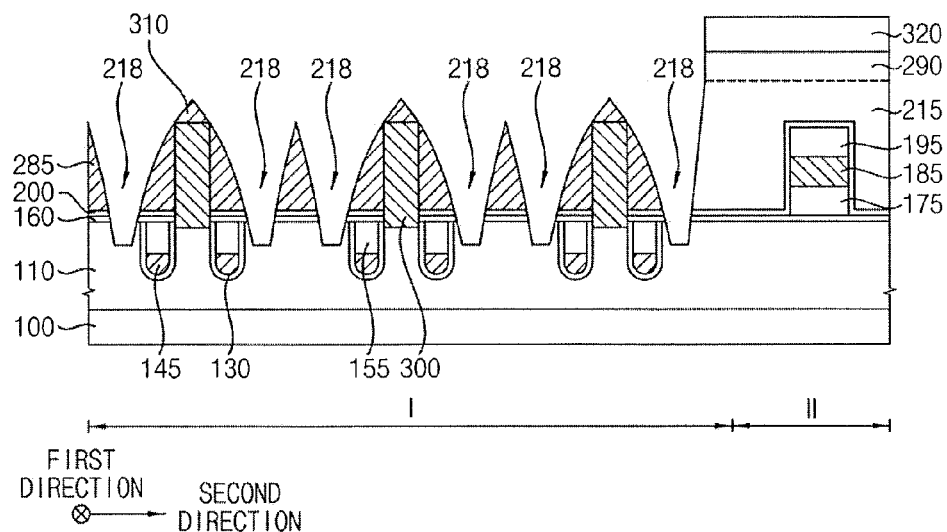
Figure 35:
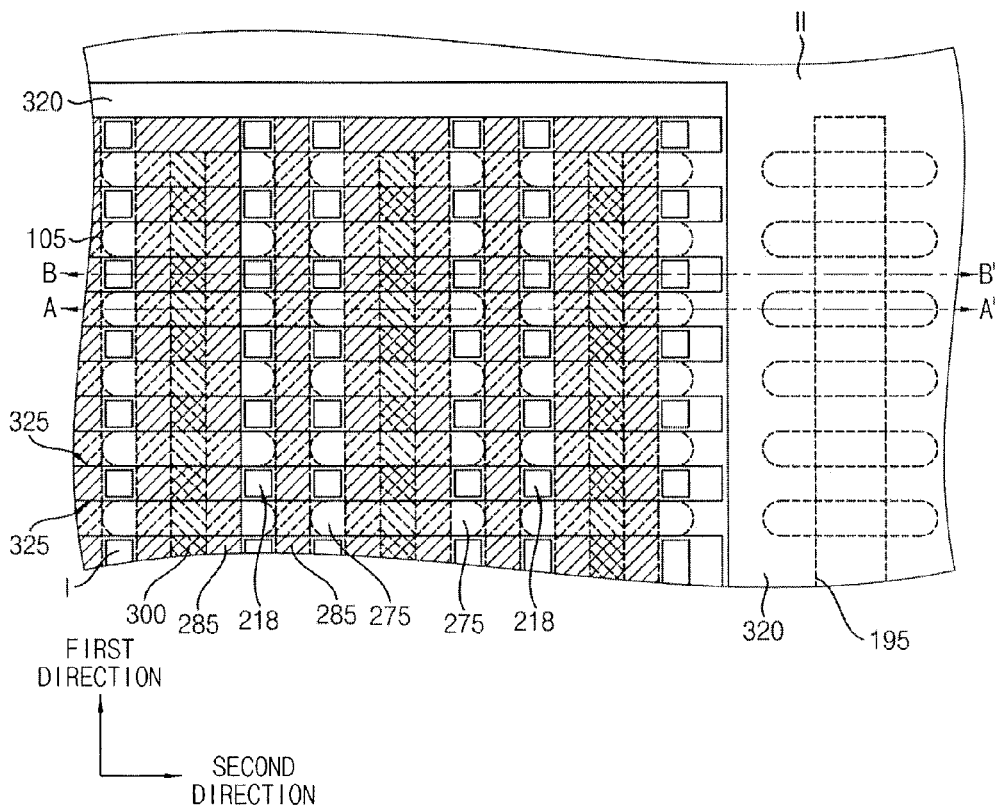

Referring to FIGS. 34 and 35, the second capping layer 290 and the second patterns 275 may be etched using the fourth mask 320 as an etching mask. In example embodiments, the etching process may be performed by a dry etching process. When the dry etching process is performed, portions of the first patterns 285 and the fourth capping layer patterns 310 adjacent to the second patterns 275 may be removed. However, the source lines 300 may be protected by the fourth capping layer patterns 310, and thereby may not be removed.

During the dry etching process, portions of the etch stop layer 200, the second gate insulation layer 160, and the substrate 100 under the second patterns 275 may also be removed to form ninth openings 218 exposing upper portions of the substrate 100.

Figure 36:
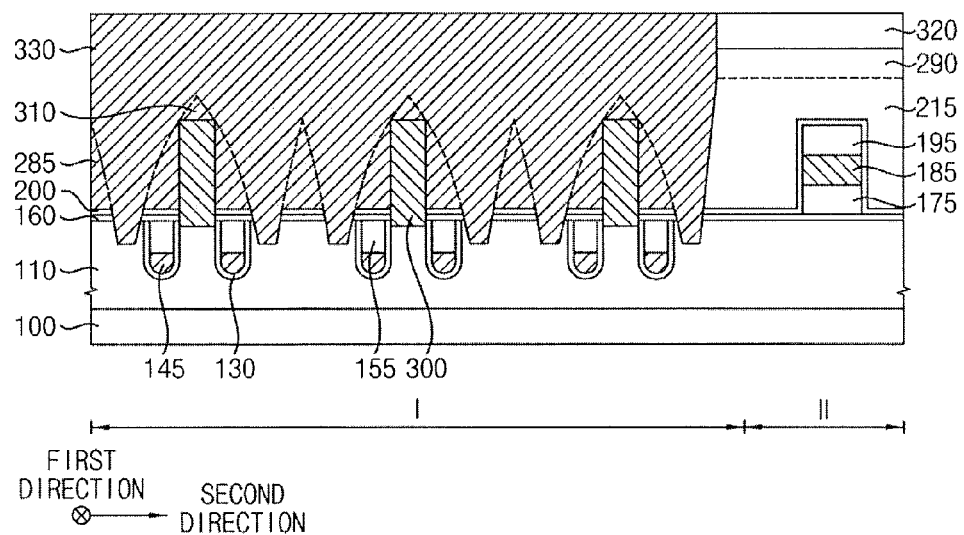
Figure 37:
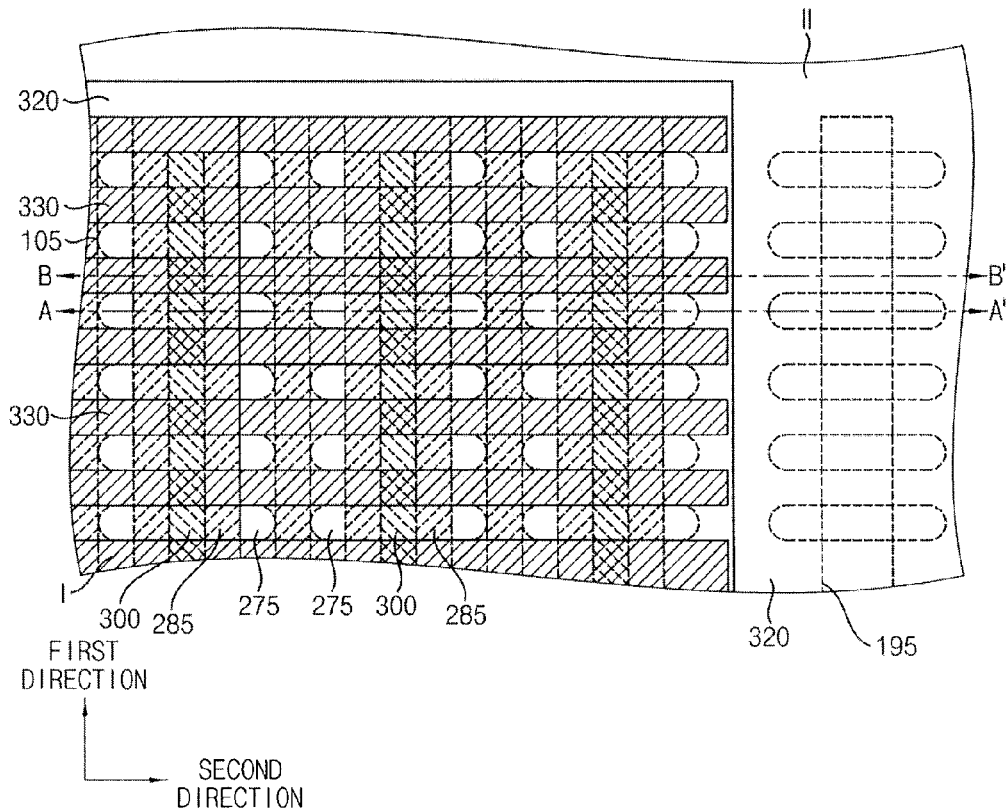
Figure 38:
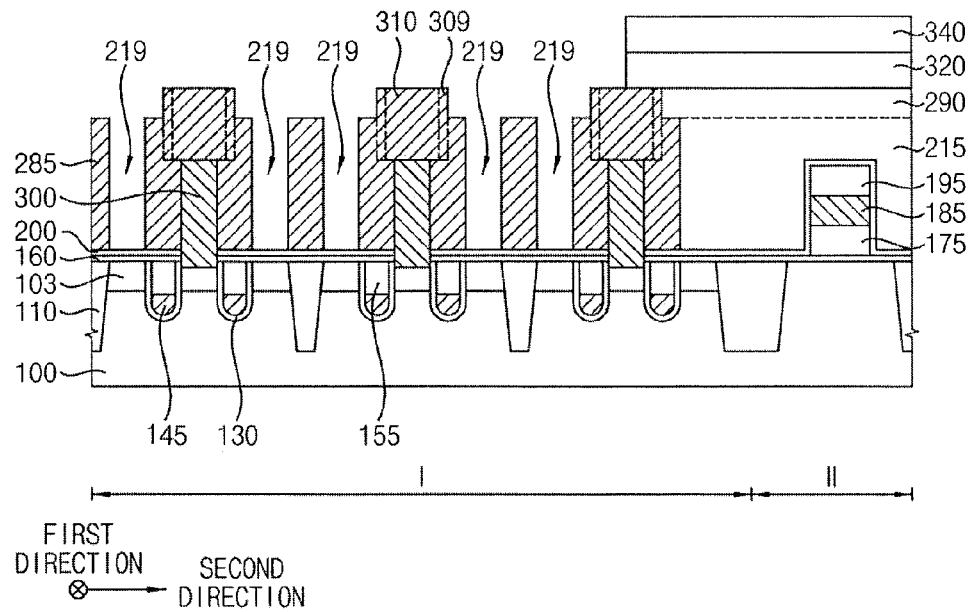
Figure 39:
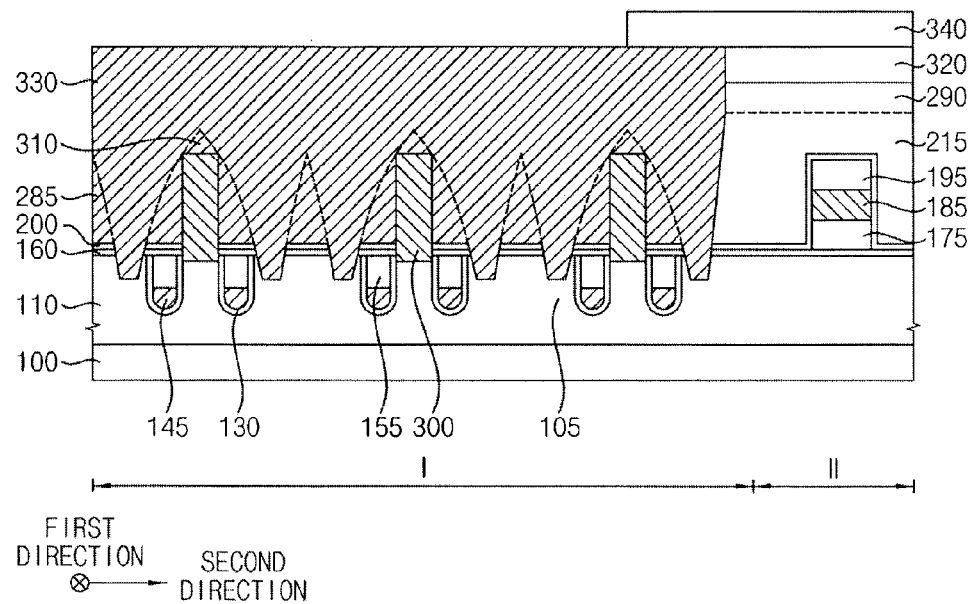

Referring to FIGS. 36 and 37, third patterns 330 filling the ninth openings 218 may be formed. The third patterns 330 may be formed by forming an insulation layer on the substrate 100, the first patterns 285, the fourth capping layer patterns 310, and the fourth mask 320 to sufficiently fill the ninth openings 218. An upper portion of the insulation layer may be planarized. In an example embodiment, the planarization process may be performed until an upper portion of the fourth mask 320 is removed. The insulation layer may be formed to include, e.g., silicon nitride, and thereby may be merged into the first patterns 285, the fourth capping layer patterns 310, the etch stop layer pattern 309 and the second capping layer 290.

In example embodiments, each third pattern 330 may extend in the second direction. A plurality of third patterns 330 may be formed in the first direction. Thus, sidewalls of the second patterns 275 may be surrounded by the first and third patterns 285 and 330.

Referring to FIGS. 38 to 41, after a third photoresist pattern 340 is formed on the third patterns 330 and the fourth mask 320, the second capping layer 290 and the second patterns 275 may be etched using the third photoresist pattern 340 as an etching mask. The third photoresist pattern 340 may cover the second region II and a portion of the first region I adjacent thereto. In example embodiments, the third photoresist pattern 340 may cover the second region II, portions of closest ones of the source lines 300 to the second region II in the second direction, and portions of closest ones of the third patterns 330 to the second region II in the first direction. Thus, the sacrificial layer pattern 215 in the second region II may be protected during the etching process.

In example embodiments, the exposed second capping layer 290 and the second patterns 275 therebeneath may include a material having an etching selectivity with respect to the first and third patterns 285 and 330, the fourth capping layer patterns 310, and the etch stop layer patterns 309, e.g., silicon oxide, and thus may be removed by a wet etching process using, e.g., hydrofluoric acid as an etching solution.

Portions of the etch stop layer 200 and the second gate insulation layer 160 under the second patterns 275 may be removed to form tenth openings 219 exposing upper portions of the substrate 100. In example embodiments, portions of the etch stop layer 200 and second gate insulation layer 160 may be removed by a dry etching process.

Referring to FIGS. 42 to 46, a contact plug 350 and a pad layer 360 filling each tenth opening 219 may be formed. The contact plugs 350 and the pad layers 360 may be formed by forming a second conductive layer on the substrate 100, the first and third patterns 285 and 330, the fourth capping layer patterns 310, the etch stop layer patterns 309 and the fourth mask 320. An upper portion of the second conductive layer may then be planarized.

An upper portion of the planarized second conductive layer may serve as the pad layer 360. A lower portion of the planarized second conductive layer may serve as the contact plug 350. That is, the contact plug 350 and the pad layer 360 may be formed to include substantially the same material by a single process. Thus, the contact plug 350 and pad layer 360 may be integrally formed. The pad layer 360 may be formed self-aligned with the contact plug 350. Thus, the pad layer 360 may be formed not by an additional process, but by the same process for forming the contact plug 350, which may reduce the etching process for forming minute patterns.

The second conductive layer may be formed to include a metal, e.g., tungsten, titanium, tantalum, etc., and/or a metal nitride, e.g., tungsten nitride, titanium nitride, tantalum nitride, etc.

The contact plugs 350 may be formed both in the first and second directions. Each contact plug 350 may contact the impurity region 103 of the substrate 100. In example embodiments, two contact plugs 350 may be formed in the second direction between two source lines 300.

Each pad layer 360 may be formed on two contact plugs 350 disposed in the second direction between neighboring source lines 300. Each pad layer 360 may have a horizontal cross-section wider than a sum of horizontal cross-sections of the two contact plugs 350. A pair of sidewalls, parallel to each other, of each pad layer 360 may be covered by the etch stop layer pattern 309. The other pair of sidewalls parallel to each other of each pad layer 360 may be covered by the third patterns 330. In example embodiments, a top surface of the pad layers 360 may be substantially coplanar with those of the third patterns 330, the fourth capping layer patterns 310, and the etch stop layer patterns 309.

Figure 47:
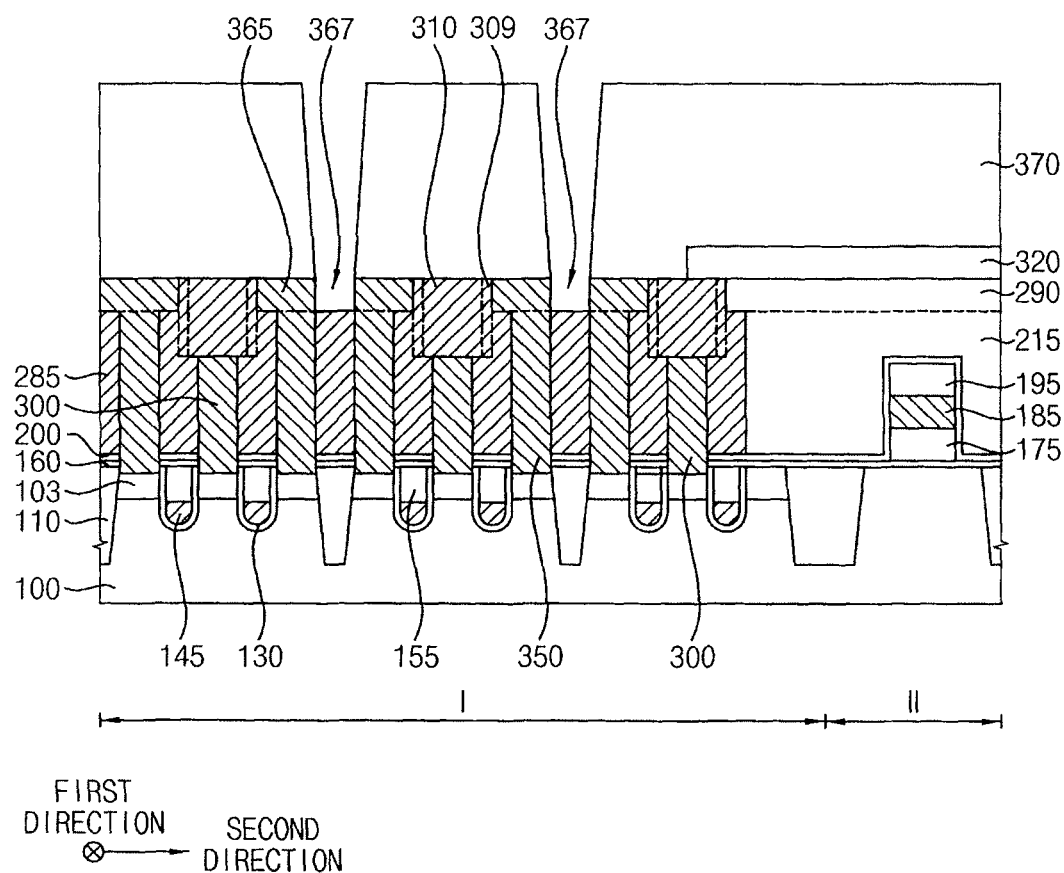
Figure 48:
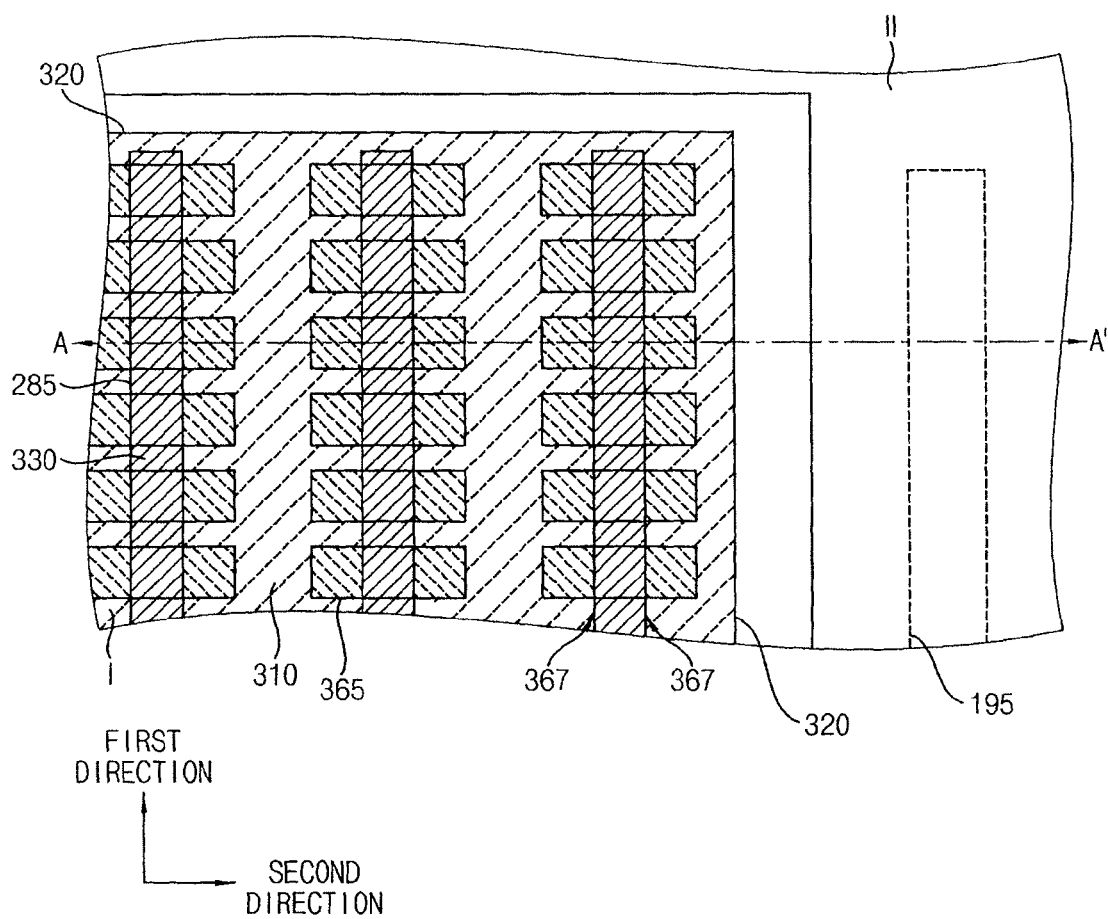

Referring to FIGS. 47 and 48, a fifth mask 370 may be formed on the pad layers 360, the fourth capping layer patterns 310, the etch stop layer patterns 309, and the fourth mask 320. The pad layers 360 may be patterned using the fifth mask 370 as an etching mask to form a plurality of pads 365 divided by eleventh openings 367. In example embodiments, the fifth mask 370 may expose portions of the pad layers 360 on the first patterns 285. Thus, the eleventh openings 367 may expose the first patterns 285.

Each pad layer 360 may be divided into two pads 265 by the patterning process. Each pad 365 may be formed on each first contact plug 350. A width of each pad 365 in the second direction may be wider than that of each contact plug 350.

Figure 49:
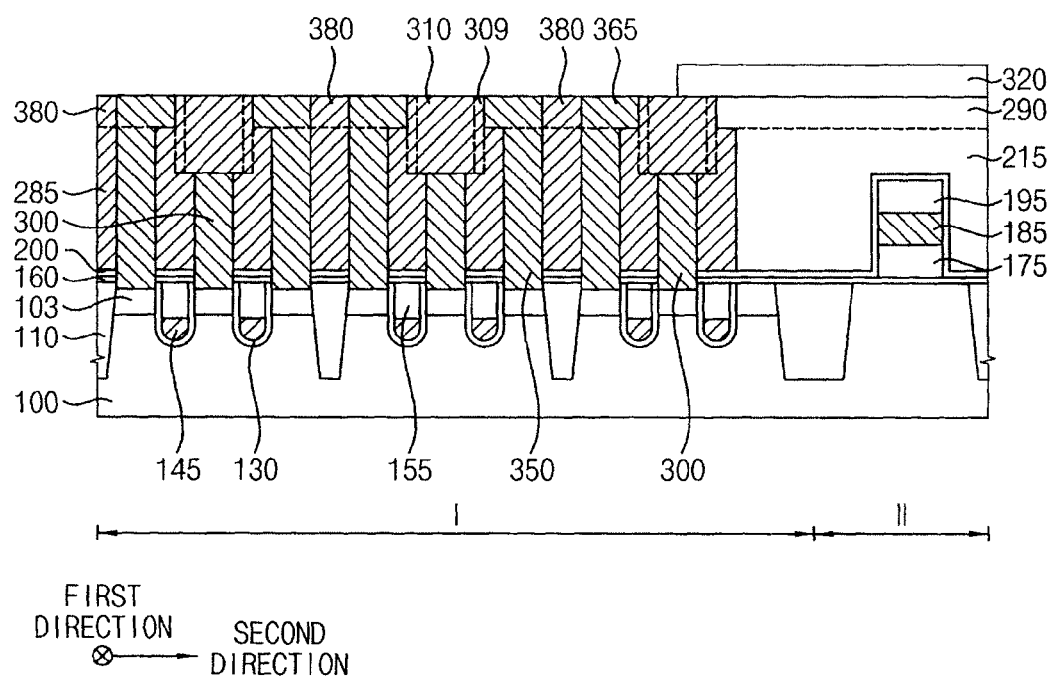
Figure 50:
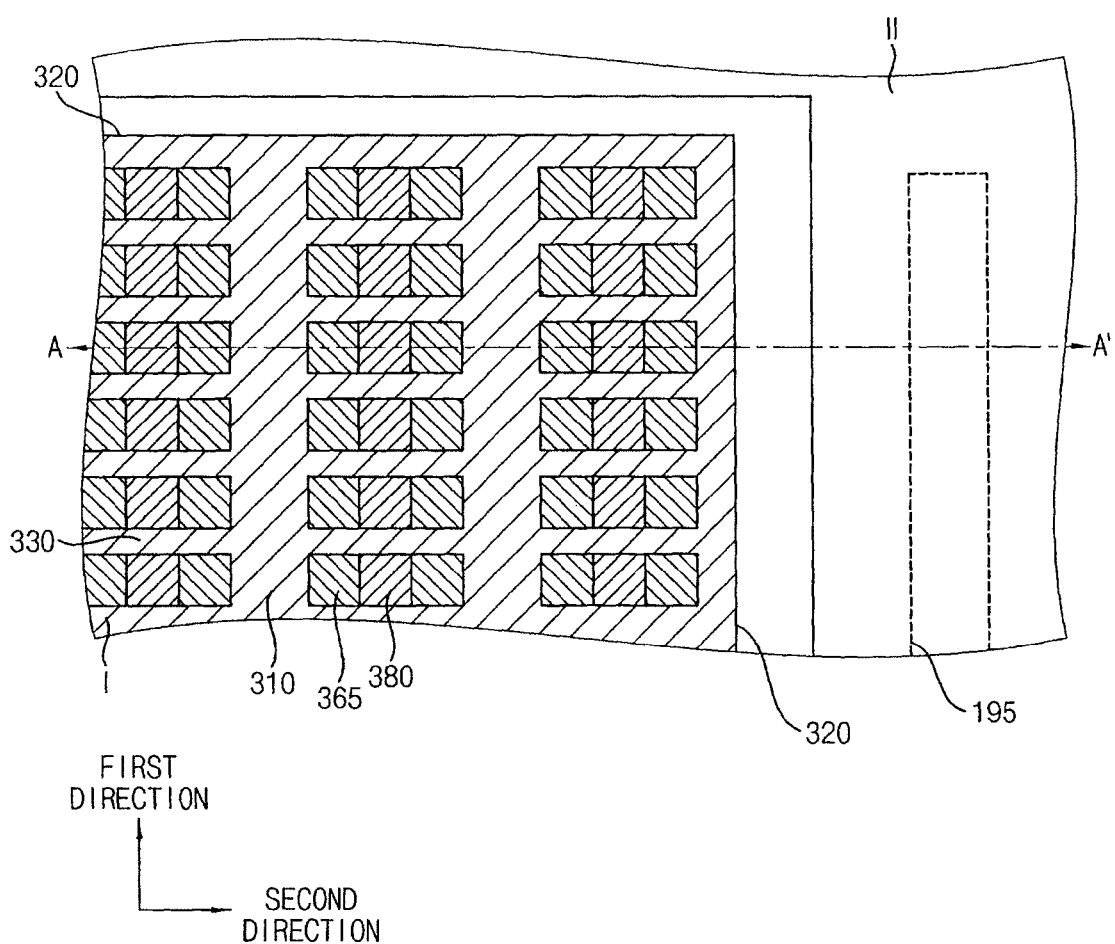

Referring to FIGS. 49 and 50, after removing the fifth mask 370, a division layer pattern 380 filling each eleventh opening 367 may be formed. The division layer pattern 380 may be formed by forming an insulation layer on the third patterns 330, the pads 365, the fourth capping layer patterns 310, the etch stop layer patterns 309, and the fourth mask 320 to fill the eleventh openings 367. An upper portion of the insulation layer may then be planarized. The insulation layer may be formed to include, e.g., silicon nitride.

Figure 53:
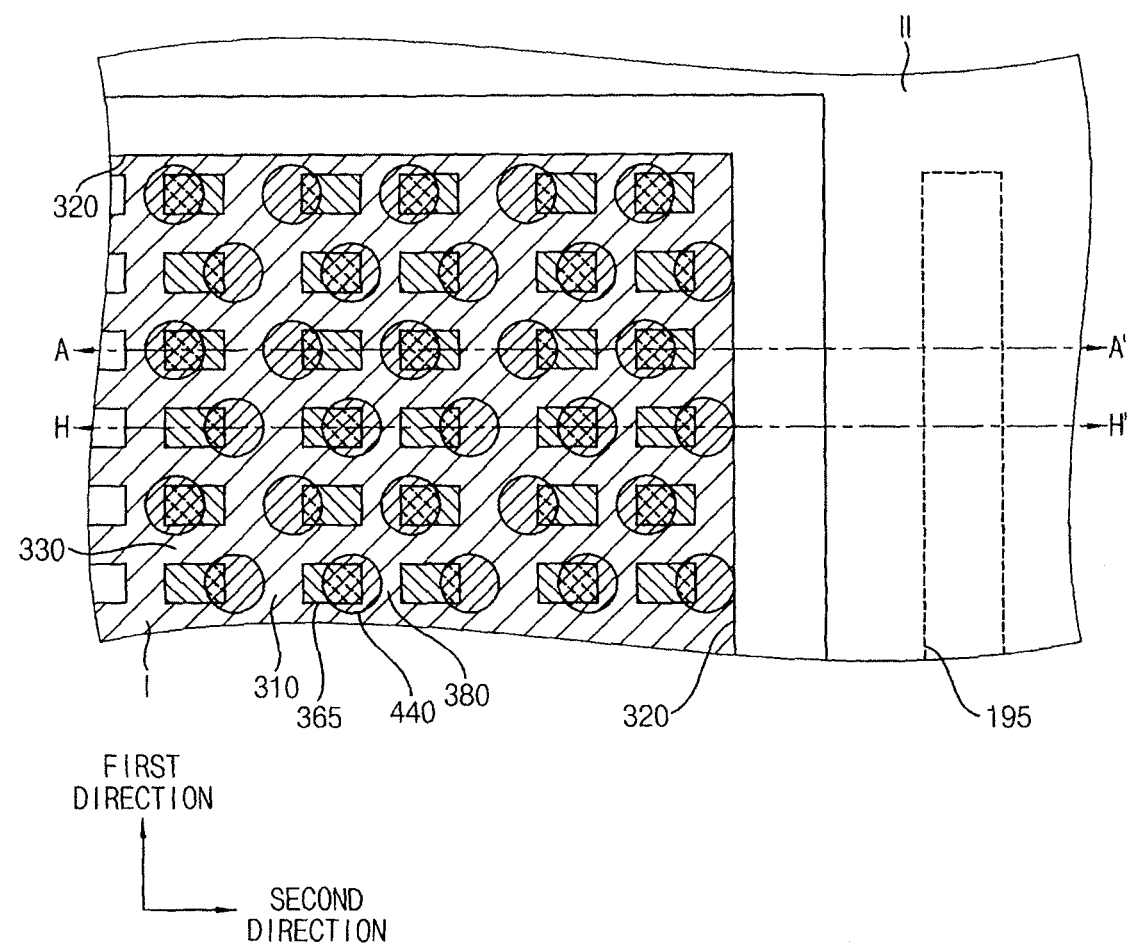

Referring to FIGS. 51 to 53, a lower electrode 390, a magnetic tunnel junction (MTJ) structure 430, and an upper electrode 440 may be formed to be sequentially stacked on each pad 365. In an example embodiment, the MTJ structure 430 may include a fixed layer structure pattern 400, a tunnel barrier layer pattern 410, and a free layer pattern 420 that are sequentially stacked.

Particularly, a lower electrode layer, a fixed layer structure, a tunnel barrier layer, a free layer, and an upper electrode layer may be sequentially formed on the pads 365, the division layer patterns 380, the fourth capping layer patterns 310, the etch stop layer patterns 309 and the fourth mask 320. The upper electrode layer may be patterned by a photolithography process to form the upper electrode 440. By a dry etch process using the upper electrode 440 as an etching mask, the free layer, the tunnel barrier layer, the fixed layer structure, and the lower electrode layer may be patterned to form the lower electrode 390, the fixed layer structure pattern 400, the tunnel barrier layer pattern 410, and the free layer pattern 420 sequentially stacked on each pad 365. The lower and upper electrode layers may be formed to include a metal and/or a metal nitride.

A barrier layer may be formed on the lower electrode layer to prevent a metal of the fixed layer structure from growing abnormally. The barrier layer may be formed to include an amorphous metal or a metal nitride, e.g., tantalum, tantalum nitride, titanium, titanium nitride, etc.

In an example embodiment, the fixed layer structure may include a pinning layer, a lower ferromagnetic layer, anti-ferromagnetic coupling spacer layer, and an upper ferromagnetic layer. The pinning layer may be formed to include, e.g., FeMn, IrMn, PtMn, MnO, MnS, MnTe, $MnF_2$, $FeF_2$, $FeCl_2$, FeO, $CoCl_2$, CoO, $NiCl_2$, NiO, Cr, etc. The lower and upper ferromagnetic layers may be formed to include, e.g., Fe, Ni, Co, etc. The anti-ferromagnetic coupling spacer layer may be formed to include, e.g., Ru, Ir, Rh, etc.

The tunnel barrier layer may be formed to include, e.g., aluminum oxide or magnesium oxide. The free layer may be formed to include, e.g., Fe, Ni, Co, etc. The MTJ structure 430 and the process for forming the MTJ structure 430 may not be limited to the above description.

The dry etching process using the upper electrode 440 as an etching mask may include, e.g., a plasma reaction etching process or a sputtering process. The plasma reaction etching process may be performed using an etching gas containing a fluorine-containing gas and ammonia gas, and a reaction gas containing oxygen for reducing the consumption of the upper electrode 440.

When the dry etching process is performed, a conductive polymer may be attached to sidewalls of the MTJ structures 430. Thus, the fixed layer structure pattern 400 and the free layer pattern 420 may be electrically shorted. In order to prevent the electrical short, MTJ structures 430 may be formed to be spaced from each other. In example embodiments, the MTJ structures 430 may be formed at vertices and centers of hexagons when viewed from a top side.

Each MTJ structure 430 may contact each pad 365 through the lower electrode 390, and may be electrically connected to the impurity region 103 of the substrate 100 via each contact plug 350 integrally formed with each pad 365. Thus, the MTJ structures 430 or the lower electrodes 390 may be formed to be arranged in consideration of locations of the pads 365. Hereinafter, only locations of the MTJ structures 430 may be described for the convenience of explanation.

A plurality of MTJ structures 430 may be disposed both in the first and second directions to form an MTJ structure array. One MTJ structure 430 may overlap one pad 365. The MTJ structure array may include a plurality of MTJ structure rows disposed in the first direction. Each MTJ structure row may include a plurality of MTJ structures 430 disposed in the second direction linearly. The MTJ structure array may include a plurality of MTJ structure columns disposed in the second direction. Each MTJ structure column may include a plurality of MTJ structures 430 disposed in the first direction in a zigzag fashion.

Thus, areas at which MTJ structures 430 overlap corresponding pads 365 may be varied according to positions thereof. For example, in the same MTJ structure row, an area at which an odd numbered MTJ structure 430 in the second direction overlaps corresponding pad 365 may be different from an area at which an even numbered MTJ structure 430 in the second direction overlaps corresponding pad 365. Additionally, in the same MTJ structure column, an area at which an odd numbered MTJ structure 430 in the first direction overlaps corresponding pad 365 may be different from an area at which an even numbered MTJ structure 430 in the first direction overlaps corresponding pad 365.

The MTJ structures 430 in the above MTJ structure array may be disposed at vertices and centers of hexagons. This arrangement may allow the MTJ structures to be spaced from one another at maximum distances. The MTJ structures 430 may be disposed to correspond to the pads 365 in one-to-one correspondence.

Referring to FIGS. 54 to 56, a second insulating interlayer 450 may be formed on the pads 365, the division layer patterns 380, the fourth capping layer patterns 310, the etch stop layer patterns 309, and the fourth mask 320 to cover the lower electrode 390, the MTJ structure and the upper electrode 440. A bit line 460 contacting the upper electrode 440 may be formed on the second insulating interlayer 450 to manufacture the MRAM device.

The second insulating interlayer 450 may be formed to include, e.g., silicon oxide. The bit line 460 may be formed to include, e.g., a metal, a metal nitride and/or a metal silicide. In example embodiments, the bit line 460 may extend in the second direction, and a plurality of bit lines 460 may be formed in the first direction.

As discussed above, in a method of manufacturing the MRAM device, contact plug 350 and pad layer 360 may be integrally formed by a single process. Also, the pad layer 360 may be divided into pads 365 by a simple process. Thus, pads 365 having a minute size may be easily formed. Additionally, the MTJ structures 430 corresponding to the pads 365 may be formed to be spaced from one another at maximum or other predetermined distances, so that failures generated in the etching process for forming the MTJ structures 430 may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an MRAM device, comprising:
    forming first and second patterns on a substrate, the first and second patterns being disposed alternately and repeatedly and contacting each other;
    forming a first capping layer on top surfaces of the first and second patterns;
    removing first portions of the first capping layer and a portion of the second patterns thereunder to form first openings exposing the substrate;
    forming source lines filling lower portions of the first openings, respectively;
    forming second capping layer patterns filling upper portions of the first openings, respectively;
    removing second portions of the first capping layer and a portion of the second patterns thereunder to form second openings exposing the substrate; and
    integrally forming contact plugs and pad layers sequentially stacked on the substrate to fill the second openings, respectively.

2. The method as claimed in claim 1, wherein forming the first openings includes:
    removing the first portions of the first capping layer, upper portions of the portion of the second patterns thereunder, and upper portions of the first patterns adjacent to the portion of the second patterns to form recesses;

forming etch stop layer patterns covering sidewalls of the first capping layer exposed by the recesses; and removing lower portions of the portion of the second patterns exposed by the recesses to form third openings exposing the substrate, the third openings being in fluid communication with the recesses, respectively.

3. The method as claimed in claim 2, wherein forming the third openings includes removing the lower portions of the portion of the second patterns by a wet etch process.

4. The method as claimed in claim 2, wherein:

the first patterns, the etch stop layer patterns, and the second capping layer patterns are formed to include substantially a same material, and the first capping layer and the second patterns are formed to include substantially a same material.

5. The method as claimed in claim 4, wherein:

the first patterns, the etch stop layer patterns, and the second capping layer patterns are formed to include silicon nitride, and the first capping layer and the second patterns are formed to include silicon oxide.

6. The method as claimed in claim 2, wherein forming the etch stop layer patterns includes:

forming an etch stop layer on inner walls of the recesses and the first capping layer; and anisotropically etching the etch stop layer to form the etch stop layer patterns on sidewalls of the recesses.

7. The method as claimed in claim 2, wherein forming the source lines includes:

forming a conductive layer filling the third openings and at least a portion of the recesses; and removing an upper portion of the conductive layer to form the source lines filling the third openings, respectively.

8. The method as claimed in claim 7, wherein forming the second capping layer patterns includes:

forming a second capping layer on the source lines and the first capping layer to fill the recesses; and planarizing an upper portion of the second capping layer until a top surface of the first capping layer is exposed.

9. The method as claimed in claim 1, wherein forming the second openings includes removing the second portions of the first capping layer and the portion of the second patterns thereunder by a wet etch process.

10. The method as claimed in claim 1, further comprising:

dividing each pad layer into a plurality of pads, after integrally forming the contact plugs and the pad layers.

11. The method as claimed in claim 10, further comprising:

forming MTJ structures electrically connected to respective ones of the pads, after dividing each pad layer into the plurality of pads.

12. The method as claimed in claim 11, wherein the MTJ structures are formed at vertices and centers of hexagons when viewed from a top side.

13. The method as claimed in claim 10, wherein dividing each pad layer into the plurality of pads includes:

partially removing the pad layers to form fourth openings exposing top surfaces of the first patterns; and forming division layer patterns filling the fourth openings, respectively.

14. The method as claimed in claim 1, wherein forming the first and second patterns includes:

forming the first and second patterns on the substrate alternately and repeatedly in a second direction substantially parallel to a top surface of the substrate, each of the first patterns and each of the second patterns extending in a first direction substantially parallel to the top surface of the substrate and substantially perpendicular to the second direction, and wherein forming the first openings includes forming the first openings to extend in the first direction.

15. The method as claimed in claim 14, wherein forming the first openings includes removing $(3n-2)^{th}$ second patterns in the second direction, where n is a positive integer.

16. The method as claimed in claim 15, wherein forming the second openings includes removing the second portions of the first capping layer, and $(3n)^{th}$ and $(3n-1)^{th}$ second patterns in the second direction.

17. The method as claimed in claim 16, further comprising:

dividing each pad layer into two pads, after integrally forming the contact plugs and the pad layers.

18. The method as claimed in claim 14, wherein, after forming the second capping layer patterns, the method includes:

forming a mask on the first capping layer and the second capping layer patterns, the mask including a plurality of fifth openings disposed in the first direction, each of the fifth openings extending in the second direction;

removing third portions of the first capping layer and a portion of the second patterns thereunder to form sixth openings; and forming third patterns filling the sixth openings, respectively.

19. The method as claimed in claim 18, wherein forming the sixth openings includes removing the third portions of the first capping layer and the portion of the second patterns thereunder by a dry etching process, and wherein the source lines are protected by the second capping layer patterns during the dry etching process.

20. The method as claimed in claim 18, wherein the third patterns are formed to include substantially a same material as the first patterns and the second capping layer patterns.

21. A method for making a semiconductor device, comprising:

forming source lines in a substrate;

forming a number of contact plugs between adjacent source lines; and forming pad layers over the contact plugs;

dividing each of the pad layers into a plurality of pads; and forming MTJ structures electrically connected to respective ones of the pads, wherein each pad layer is in contact with at least two of the contact plugs and wherein the contact plugs are integrally formed with the pad layers.

22. The method as claimed in claim 21, wherein the number is greater than 1.

* * * * *